United States Patent
Lee et al.

(10) Patent No.: US 9,349,764 B1
(45) Date of Patent: May 24, 2016

(54) EMBEDDED IMAGE SENSOR PACKAGES AND METHODS OF FABRICATING THE SAME

(71) Applicant: SK hynix Inc., Icheon (KR)

(72) Inventors: Sang Yong Lee, Yongin (KR); Seung Hyun Lee, Suwon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/690,304

(22) Filed: Apr. 17, 2015

(30) Foreign Application Priority Data

Dec. 29, 2014 (KR) .................. 10-2014-0191648

(51) Int. Cl.
*H01L 27/146* (2006.01)

(52) U.S. Cl.
CPC ...... *H01L 27/14618* (2013.01); *H01L 27/1462* (2013.01); *H01L 27/14636* (2013.01); *H01L 27/14638* (2013.01)

(58) Field of Classification Search
None
See application file for complete search history.

(56) References Cited

U.S. PATENT DOCUMENTS

| | | | |
|---|---|---|---|
| 7,141,782 B2 | 11/2006 | Chen | |
| 2013/0292787 A1* | 11/2013 | Yang | H01L 27/14618 257/432 |
| 2014/0312503 A1* | 10/2014 | Seo | H01L 27/14618 257/774 |
| 2015/0221698 A1* | 8/2015 | Gambino | H01L 31/0203 438/637 |
| 2015/0340397 A1* | 11/2015 | Seo | H01L 27/14627 257/432 |

\* cited by examiner

*Primary Examiner* — Joseph Schoenholtz

(57) ABSTRACT

An embedded image sensor package includes a core layer having a cavity therein, an image sensor chip disposed in the cavity and having a top surface on which a light receiver and connection members are disposed, a first insulation layer disposed on a top surface of the core layer and the top surface of the image sensor chip and having an opening that defines a light receiving area including the light receiver, a protection layer disposed between the light receiver and the first insulation layer to surround the light receiver, and a light transmission layer disposed on the light receiver. The protection layer is disposed along edges of the light receiving area. Related methods are also provided.

22 Claims, 20 Drawing Sheets

EMBEDDED IMAGE SENSOR PACKAGES AND METHODS OF FABRICATING THE SAME

CROSS-REFERENCE TO RELATED APPLICATION

The present application claims priority under 35 U.S.C 119(a) to Korean Application No. 10-2014-0191648, filed on Dec. 29, 2014, in the Korean Intellectual Property Office, which is incorporated herein by reference in its entirety as set forth in full.

BACKGROUND

1. Technical Field

Embodiments of the present disclosure relate to embedded packages and methods of fabricating the same and, more particularly, to embedded image sensor packages and methods of fabricating the same.

2. Related Art

Image sensors are devices that receive light to generate electrons and convert the electrons into image signals. These image sensors are widely used in digital cameras, digital camcorders, various portable devices, or the like. The image sensors may include charge coupled devices (CCDs) and complementary metal-oxide-semiconductor (CMOS) image sensors. The CMOS image sensors may be readily integrated with signal processing circuits on a single chip, thus enabling products including the CMOS image sensors to be scaled down. In addition, the CMOS image sensors may operate with low power consumption. Thus, the CMOS image sensors have been widely employed in portable electronic devices.

Packages including the image sensors (hereinafter, referred to as image sensor packages) may be provided in a chip scale package (CSP) form or in a chip on board (COB) package form. The CSP may correspond to a wafer level package, and the COB package may be realized by mounting an image sensor on a printed circuit board (PCB). The image sensor packages at a wafer level may be provided in units of wafers. Thus, there may be a limitation in reducing the manufacturing costs of the image sensor packages at a wafer level. Recently, embedded image sensor packages have been proposed to reduce the manufacturing costs thereof. The embedded image sensor packages may be provided in units of panels or substrates, each of which has an area that is at least twice that of a wafer. Thus, throughput of the embedded image sensor packages may increase.

SUMMARY

Various embodiments are directed to embedded image sensor packages and methods of fabricating the same.

According to an embodiment, there is provided an embedded image sensor package. The embedded image sensor package includes a core layer having a cavity therein, an image sensor chip disposed in the cavity and having a top surface on which a light receiver and connection members are disposed, a first insulation layer disposed on a top surface of the core layer and the top surface of the image sensor chip and having an opening that defines a light receiving area including the light receiver, a protection layer disposed between the light receiver and the first insulation layer to surround the light receiver, and a light transmission layer disposed on the light receiver. The protection layer is disposed along edges of the light receiving area.

According to another embodiment, there is provided a method of fabricating an embedded image sensor package. The method includes providing an image sensor chip having a top surface on which a light receiver is disposed, forming a metal mask that is disposed to cover a top surface and sidewalls of the light receiver and connection members that are disposed on the top surface of the image sensor chip, and inserting the image sensor chip into a cavity of a core layer. An insulation layer is formed on the core layer to cover the image sensor chip. The insulation layer is formed to have an opening that defines a light receiving area including the light receiver. Circuit patterns are formed on a top surface of the insulation layer. A protection layer is formed on inner sidewalls of the insulation layer which are exposed along edges of the light receiving area. The metal mask is removed to expose the light receiver after the protection layer is formed. A light transmission layer is formed on the exposed light receiver.

According to another embodiment, there is provided a method of fabricating an embedded image sensor package. The method includes providing an image sensor chip having a top surface on which a light receiver is disposed, forming a metal mask that is disposed to cover the light receiver and connection members that are disposed on a top surface of the image sensor chip, inserting the image sensor chip into a cavity of a core layer, forming an insulation layer on the core layer to cover the image sensor chip, forming circuit patterns on a top surface of the insulation layer to expose a portion of the insulation layer located over a light receiving area including the light receiver of the image sensor chip, and removing the exposed portion of the insulation layer over the light receiving area to form an opening that defines the light receiving area and exposes the metal mask. A solder resist layer is formed on the insulation layer and the circuit patterns. The solder resist layer extending onto inner sidewalls of the insulation layer exposed by the opening corresponds to a protection layer. The metal mask is removed to expose the light receiver after the protection layer is formed. A light transmission layer is formed on the exposed light receiver.

According to another embodiment, there is provided a method of fabricating an embedded image sensor package. The method includes providing an image sensor chip having a top surface on which a light receiver is disposed, forming a metal mask that is disposed to cover the light receiver and connection members that are disposed on a top surface of the image sensor chip, inserting the image sensor chip into a cavity of a core layer, forming an insulation layer on the core layer to cover the image sensor chip, forming circuit patterns on a top surface of the insulation layer to expose a portion of the insulation layer located over a light receiving area including the light receiver of the image sensor chip, forming a solder resist layer on the insulation layer and the circuit patterns to expose the portion of the insulation layer over the light receiving area, and removing the exposed portion of the insulation layer over the light receiving area to form an opening that defines the light receiving area and exposes the metal mask. A protection layer is formed on inner sidewalls of the insulation layer, inner sidewalls of the circuit patterns connected to the connection members, and inner sidewalls of the solder resist layer which are exposed by the opening. The metal mask is removed to expose the light receiver after the protection layer is formed. A light transmission layer is formed on the exposed light receiver.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "on", "over", "above", "under", "beneath" or "below" another element, it may directly contact the other element, or at least one intervening element may be present therebetween. Accordingly, the terms such as "on", "over", "above", "under", "beneath", "below" and the like that are used herein are for the purpose of describing particular embodiments only and are not intended to limit the scope of the present disclosure.

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). The term "chip" used herein may correspond to a memory chip such as a dynamic random access memory (DRAM) chip, a static random access memory (SRAM) chip, a flash memory chip, a magnetic random access memory (MRAM) chip, a resistive random access memory (ReRAM) chip, a ferroelectric random access memory (FeRAM) chip, or a phase change random access memory (PcRAM) chip. Alternatively, the term "chip" used herein may correspond to a logic chip, for example, a non-memory chip.

Figure 1:
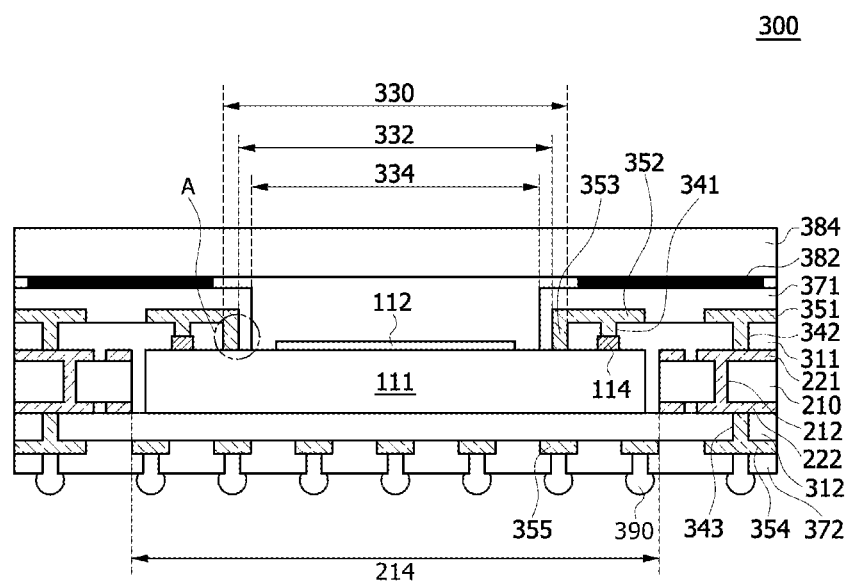
FIG. 1 is a cross-sectional view illustrating an embedded image sensor package according to an embodiment.

FIG. 1 is a cross-sectional view illustrating an embedded image sensor package 300 according to an embodiment. Referring to FIG. 1, the embedded image sensor package 300 may include a core layer 210 having a cavity 214 therein and an image sensor chip 111 disposed in the cavity 214 of the core layer 210. The core layer 210 may include an insulation material. A light receiver 112 and connection members 114 may be disposed on a top surface of the image sensor chip 111. The light receiver 112 may be disposed on an image sensing area that receives light. In general, the image sensing area may be located at a central portion of the image sensor chip 111. The connection members 114 may provide electrical signal paths between the image sensor chip 111 and external circuits. In some embodiments, the connection members 114 may be bumps. The connection members 114 may include a metal material. In some other embodiments, the connection members 114 may be pads. The number of connection members 114 may be two or more, and the plurality of connection members 114 may be adjacent to the light receiver 112.

At least one first upper circuit pattern 221 may be disposed on a top surface of the core layer 210, and at least one first lower circuit pattern 222 may be disposed on a bottom surface of the core layer 210. The first upper circuit pattern 221 may be electrically connected to the first lower circuit pattern 222 via a through electrode 212 that vertically penetrates the core layer 210. In some embodiments, a surface of the first lower circuit pattern 222 may be coplanar with a bottom surface of the image sensor chip 111. A planar area of the cavity 214 in the core layer 210 may be greater than a planar area of the image sensor chip 111. Thus, sidewalls of the cavity 214 may be spaced apart from sidewalls of the image sensor chip 111. That is, there may be gaps between the sidewalls of the cavity 214 and the sidewalls of the image sensor chip 111. The core layer 210 may be thicker or thinner than the image sensor chip 111.

The image sensor chip 111 and the core layer 210 may be covered with a first insulation layer 311 and a second insulation layer 312. The first insulation layer 311 may fill the gaps between the image sensor chip 111 and the core layer 210 and may cover a top surface of the core layer 210, the first upper circuit pattern 221, a top surface of the image sensor chip 111, and the connection members 114. The second insulation layer 312 may cover a bottom surface of the core layer 210, the first lower circuit pattern 222, and a bottom surface of the image sensor chip 111. In some embodiments, the first and second insulation layers 311 and 312 may include the same material. Alternatively, a material of the first insulation layer 311 may be different from a material of the second insulation layer 312. The first insulation layer 311 may have a first opening 330 that exposes the light receiver 112 on the image sensor chip 111. The first opening 330 may define a light receiving area including the light receiver 112. The first insulation layer 311 may have first upper via holes 341 exposing the connection members 114 and second upper via holes 342 exposing the first upper circuit patterns 221. The second insulation layer 312 may have lower via holes 343 exposing the first lower circuit patterns 222.

In some embodiments, a planar area of the first opening 330 may be greater than a planar area of the light receiver 112. Thus, sidewalls of the first insulation layer 311 exposed by the first opening 330 may be spaced apart from sidewalls of the light receiver 112. That is, there may be gaps between the sidewalls of the first opening 330 and the sidewalls of the light receiver 112. In some embodiments, the first and second insulation layers 311 and 312 may include an insulation material having a relatively low thermal expansion coefficient. For example, each of the first and second insulation layers 311 and 312 may include a polymer resin material that contains inorganic filler, which has a low thermal expansion coefficient relative to an unfilled polymer.

Second upper circuit patterns 351 and 352 may be disposed on a top surface of the first insulation layer 311. The second upper circuit patterns 351 may fill the second upper via holes 342 and may be electrically connected to the first upper circuit patterns 221. The second upper circuit patterns 352 may fill the first upper via holes 341 and may be electrically connected to the connection members 114. Second lower circuit patterns 354 and 355 may be disposed on a bottom surface of the second insulation layer 312. The second lower circuit patterns 354 may fill the lower via holes 343 and may be electrically connected to the first lower circuit patterns 222. Although not shown in the drawings, the second lower circuit patterns 355 may penetrate the second insulation layer 312 and may be electrically connected to circuit patterns other than the first lower circuit patterns 222.

A protection layer 353 may cover sidewalls of the first opening 330 that exposes the light receiver 112 on the image sensor chip 111. As illustrated in a portion 'A' of FIG. 1, the protection layer 353 may extend from the second upper circuit patterns 352 to cover the sidewalls of the first opening 330 that penetrates the first insulation layer 311 to expose the light receiver 112. Thus, the protection layer 353 may be the same material as the second upper circuit patterns 352. In some embodiments, the second upper circuit patterns 352 and the protection layer 353 may be a metal layer such as a copper layer. If the second upper circuit patterns 352 and the protection layer 353 include a metal layer, the second upper circuit patterns 352 and the protection layer 353 may be formed using an electroplating process. The protection layer 353 may cover all of the sidewalls of the first opening 330. That is, the protection layer 353 may cover all of the inner sidewalls of the first insulation layer 311 that define the first opening 330. A second opening 332, which is narrower than the first opening 330, may be defined by inner sidewalls of the protection layer 353. In the present embodiment, a planar area of the second opening 332 may be less than a planar area of the first opening 330, and the inner sidewalls of the protection layer 353 exposed by the second opening 332 may be spaced apart from sidewalls of the light receiver 112. In some embodiments, a planar area of the second opening 332 may be equal to a planar area of the light receiver 112.

A first solder resist layer 371 may be disposed on a top surface of the first insulation layer 311 to cover the second upper circuit patterns 351 and 352 and the protection layer 353. The first solder resist layer 371 may cover the inner sidewalls of the protection layer 353. In such a case, a third opening 334, which is narrower than the second opening 332, may be defined by inner sidewalls of the first solder resist layer 371. The light receiver 112 may be exposed by the third opening 334. In the present embodiment, a planar area of the third opening 334 may be greater than a planar area of the light receiver 112, and the inner sidewalls of the first solder resist layer 371 exposed by the third opening 334 may be spaced apart from the sidewalls of the light receiver 112.

An adhesive agent 382 may be disposed on the first solder resist layer 371, and a light transmission layer 384 may be attached to the first solder resist layer 371 using the adhesive agent 382 to cover the third opening 334. In such a case, an empty space may exist between the light transmission layer 384 and the light receiver 112. A second solder resist layer 372 may be disposed on a bottom surface of the second insulation layer 312 to cover the second lower circuit patterns 354 and 355. The second solder resist layer 372 may have openings that expose the second lower circuit patterns 354 and 355, and a plurality of solder balls 390 may be disposed in the openings to contact the second lower circuit patterns 354 and 355.

Figure 2:
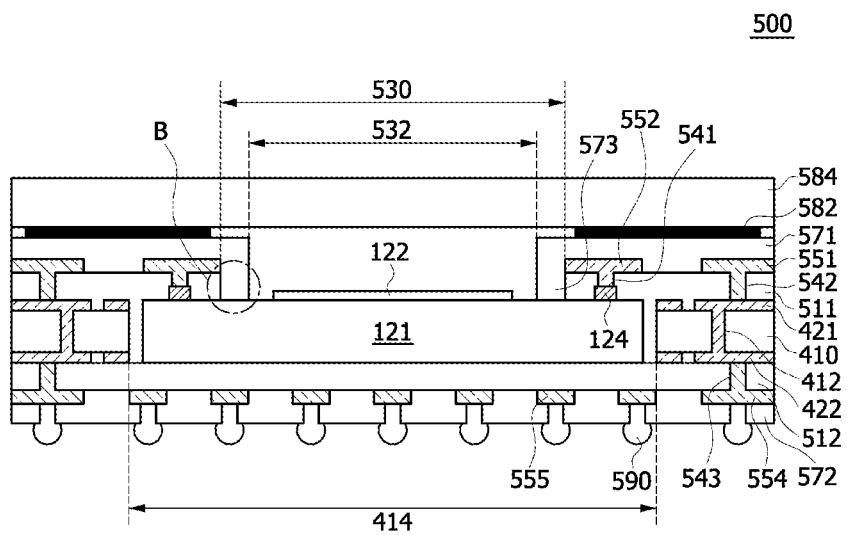
FIG. 2 is a cross-sectional view illustrating an embedded image sensor package according to another embodiment.

FIG. 2 is a cross-sectional view illustrating an embedded image sensor package 500 according to another embodiment. Referring to FIG. 2, the embedded image sensor package 500 may include a core layer 410 having a cavity 414 therein and an image sensor chip 121 disposed in the cavity 414 of the core layer 410. The core layer 410 may include an insulation material. A light receiver 122 and connection members 124 may be disposed on a top surface of the image sensor chip 121. The light receiver 122 may be disposed on an image sensing area that receives light. In general, the image sensing area may be located at a central portion of the image sensor chip 121. The connection members 124 may provide electrical signal paths between the image sensor chip 121 and external circuits. In some embodiments, the connection members 124 may be bumps. The connection members 124 may include a metal material. In some other embodiments, the connection members 124 may be pads. The number of connection members 124 may be two or more, and the plurality of connection members 124 may be adjacent to the light receiver 122.

At least one first upper circuit pattern 421 may be disposed on a top surface of the core layer 410, and at least one first lower circuit pattern 422 may be disposed on a bottom surface of the core layer 410. The first upper circuit pattern 421 may be electrically connected to the first lower circuit pattern 422 via a through electrode 412 that vertically penetrates the core layer 410. In some embodiments, a surface of the first lower circuit pattern 422 may be coplanar with a bottom surface of the image sensor chip 121. A planar area of the cavity 414 in the core layer 410 may be greater than a planar area of the image sensor chip 121. Thus, sidewalls of the cavity 414 may be spaced apart from sidewalls of the image sensor chip 121. That is, there may be gaps between the sidewalls of the cavity 414 and the sidewalls of the image sensor chip 121. The core layer 410 may be thicker or thinner than the image sensor chip 121.

The image sensor chip 121 and the core layer 410 may be covered with a first insulation layer 511 and a second insulation layer 512. The first insulation layer 511 may fill the gaps between the image sensor chip 121 and the core layer 410 and may cover a top surface of the core layer 410, the first upper circuit pattern 421, a top surface of the image sensor chip 121, and the connection members 124. The second insulation layer 512 may cover a bottom surface of the core layer 410, the first lower circuit pattern 422, and a bottom surface of the image sensor chip 121. In some embodiments, the first and second insulation layers 511 and 512 may include the same material. Alternatively, a material of the first insulation layer 511 may be different from a material of the second insulation layer 512. The first insulation layer 511 may have a first opening 530 that exposes the light receiver 122 on the image sensor chip 121. The first opening 530 may define a light receiving area including the light receiver 122. The first insulation layer 511 may have first upper via holes 541 exposing the connection members 124 and second upper via holes 542 exposing the first upper circuit patterns 421. The second insulation layer 512 may have lower via holes 543 exposing the first lower circuit patterns 422.

In some embodiments, a planar area of the first opening 530 may be greater than a planar area of the light receiver 122. Thus, sidewalls of the first insulation layer 511 exposed by the first opening 530 may be spaced apart from sidewalls of the light receiver 122. That is, there may be gaps between the sidewalls of the first opening 530 and the sidewalls of the light receiver 122. In some embodiments, the first and second insulation layers 511 and 512 may include an insulation material having a relatively low thermal expansion coefficient. For example, each of the first and second insulation layers 511 and 512 may include a polymer resin material that contains inorganic filler, which has a low thermal expansion coefficient relative to an unfilled polymer.

Second upper circuit patterns 551 and 552 may be disposed on a top surface of the first insulation layer 511. The second upper circuit patterns 551 may fill the second upper via holes 542 and may be electrically connected to the first upper circuit patterns 421. The second upper circuit patterns 552 may fill the first upper via holes 541 and may be electrically connected to the connection members 124. Second lower circuit patterns 554 and 555 may be disposed on a bottom surface of the second insulation layer 512. The second lower circuit patterns 554 may fill the lower via holes 543 and may be electrically connected to the first lower circuit patterns 422. Although not shown in the drawings, the second lower circuit patterns 555 may penetrate the second insulation layer 512 and may be electrically connected to circuit patterns other than the first lower circuit patterns 422.

A first solder resist layer 571 may be disposed on a top surface of the first insulation layer 511 to cover the second upper circuit patterns 551 and 552. As illustrated in a portion 'B' of FIG. 2, the first solder resist layer 571 may extend to cover the sidewalls of the first opening 530 that penetrates the first insulation layer 511 to expose the light receiver 122. The extension of the first solder resist layer 571 covering the sidewalls of the first opening 530 may act as a protection layer 573 that prevents the light receiver 122 from being contaminated when the first insulation layer 511 is contaminated. The protection layer 573 may cover all of the sidewalls of the first opening 530. That is, the protection layer 573 may cover all of the inner sidewalls of the first insulation layer 511 that define the first opening 530. A second opening 532, which is narrower than the first opening 530, may be defined by inner sidewalls of the protection layer 573. The light receiver 122 may be exposed by the second opening 532. In the present embodiment, a planar area of the second opening 532 may be greater than a planar area of the light receiver 122, and the inner sidewalls of the protection layer 573 exposed by the second opening 532 may be spaced apart from the sidewalls of the light receiver 122. In some embodiments, a planar area of the second opening 532 may be equal to a planar area of the light receiver 122.

An adhesive agent 582 may be disposed on the first solder resist layer 571, and a light transmission layer 584 may be attached to the first solder resist layer 571 using the adhesive agent 582 to cover the second opening 532. In such a case, an empty space may exist between the light transmission layer 584 and the light receiver 122. A second solder resist layer 572 may be disposed on a bottom surface of the second insulation layer 512 to cover the second lower circuit patterns 554 and 555. The second solder resist layer 572 may have openings that expose the second lower circuit patterns 554 and 555, and a plurality of solder balls 590 may be disposed in the openings to contact the second lower circuit patterns 554 and 555.

Figure 3:
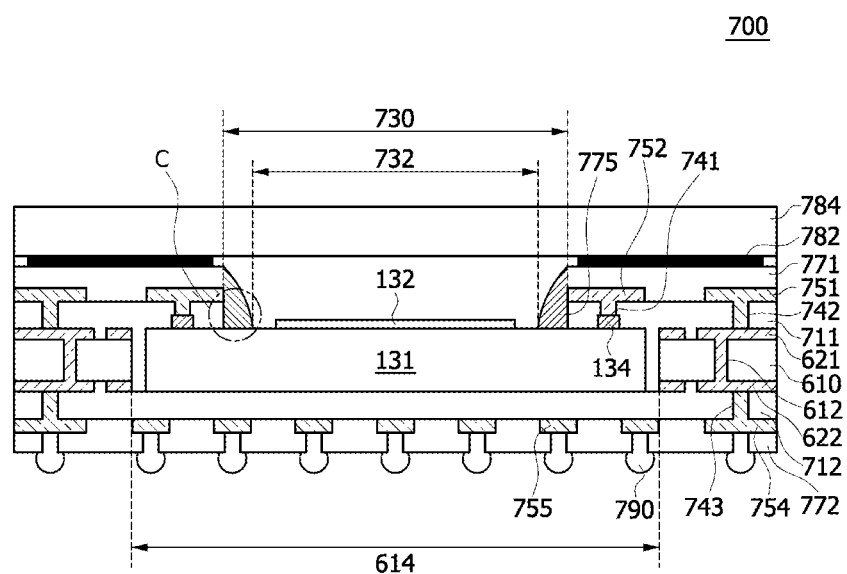
FIG. 3 is a cross-sectional view illustrating an embedded image sensor package according to yet another embodiment.

FIG. 3 is a cross-sectional view illustrating an embedded image sensor package 700 according to yet another embodiment. Referring to FIG. 3, the embedded image sensor package 700 may include a core layer 610 having a cavity 614 therein and an image sensor chip 131 disposed in the cavity 614 of the core layer 610. The core layer 610 may include an insulation material. A light receiver 132 and connection members 134 may be disposed on a top surface of the image sensor chip 131. The light receiver 132 may be disposed on an image sensing area that receives light. In general, the image sensing area may be located at a central portion of the image sensor chip 131. The connection members 134 may provide electrical signal paths between the image sensor chip 131 and external circuits. In some embodiments, the connection members 134 may be bumps. The connection members 134 may include a metal material. In some other embodiments, the connection members 134 may be pads. The number of connection members 134 may be two or more, and the plurality of connection members 134 may be adjacent to the light receiver 132.

At least one first upper circuit pattern 621 may be disposed on a top surface of the core layer 610, and at least one first lower circuit pattern 622 may be disposed on a bottom surface of the core layer 610. The first upper circuit pattern 621 may be electrically connected to the first lower circuit pattern 622 via a through electrode 612 that vertically penetrates the core layer 610. In some embodiments, a surface of the first lower circuit pattern 622 may be coplanar with a bottom surface of the image sensor chip 131. A planar area of the cavity 614 in the core layer 610 may be greater than a planar area of the image sensor chip 131. Thus, sidewalls of the cavity 614 may be spaced apart from sidewalls of the image sensor chip 131. That is, there may be gaps between the sidewalls of the cavity 614 and the sidewalls of the image sensor chip 131. The core layer 610 may be thicker or thinner than the image sensor chip 131.

The image sensor chip 131 and the core layer 610 may be covered with a first insulation layer 711 and a second insulation layer 712. The first insulation layer 711 may fill the gaps between the image sensor chip 131 and the core layer 610 and may cover a top surface of the core layer 610, the first upper circuit pattern 621, a top surface of the image sensor chip 131, and the connection members 134. The second insulation layer 712 may cover a bottom surface of the core layer 610, the first lower circuit pattern 622, and a bottom surface of the image sensor chip 131. In some embodiments, the first and second insulation layers 711 and 712 may include the same material. Alternatively, a material of the first insulation layer 711 may be different from a material of the second insulation layer 712. The first insulation layer 711 may have a first opening 730 that exposes the light receiver 132 on the image sensor chip 131. The first opening 730 may define a light receiving area including the light receiver 132. The first insulation layer 711 may have first upper via holes 741 exposing the connection members 134 and second upper via holes 742 exposing the first upper circuit patterns 621. The second insulation layer 712 may have lower via holes 743 exposing the first lower circuit patterns 622.

In some embodiments, a planar area of the first opening 730 may be greater than a planar area of the light receiver 132. Thus, sidewalls of the first insulation layer 711 exposed by the first opening 730 may be spaced apart from sidewalls of the light receiver 132. That is, there may be gaps between the sidewalls of the first opening 730 and the sidewalls of the light receiver 132. In some embodiments, the first and second insulation layers 711 and 712 may include an insulation material having a relatively low thermal expansion coefficient. For example, each of the first and second insulation layers 711 and 712 may include a polymer resin material that contains inorganic filler, which has a low thermal expansion coefficient relative to an unfilled polymer.

Second upper circuit patterns 751 and 752 may be disposed on a top surface of the first insulation layer 711. The second upper circuit patterns 751 may fill the second upper via holes 742 and may be electrically connected to the first upper circuit patterns 621. The second upper circuit patterns 752 may fill the first upper via holes 741 and may be electrically connected to the connection members 134. Second lower circuit patterns 754 and 755 may be disposed on a bottom surface of the second insulation layer 712. The second lower circuit patterns 754 may fill the lower via holes 743 and may be electrically connected to the first lower circuit patterns 622. Although not shown in the drawings, the second lower circuit patterns 755 may penetrate the second insulation layer 712 and may be electrically connected to circuit patterns other than the first lower circuit patterns 622.

A first solder resist layer 771 may be disposed on a top surface of the first insulation layer 711 to cover the second upper circuit patterns 751 and 752. Inner sidewalls of the first solder resist layer 771 may be aligned with the inner sidewalls of the first insulation layer 711 exposed by the first opening 730. As illustrated in a portion 'C' of FIG. 3, a protection layer 775 may be disposed on the inner sidewalls of the first insulation layer 711 and the first solder resist layer 771 which are exposed by the first opening 730. The protection layer 775 may have a spacer shape whose width gradually decreases away from the top surface of the image sensor chip 131. In some embodiments, the protection layer 775 may be formed by attaching an adhesive material or an underfill material onto the inner sidewalls of the first insulation layer 711 and the first solder resist layer 771 which are exposed by the first opening 730. The protection layer 775 may cover all of the sidewalls of the first opening 730. That is, the protection layer 775 may cover all of the inner sidewalls of the first insulation layer 711 and the first solder resist layer 771 that define the first opening 730. A second opening 732, which is narrower than the first opening 730, may be defined by inner sidewalls of the protection layer 775. The light receiver 132 may be exposed by the second opening 732. In some embodiments, a bottom planar area of the second opening 732 may be greater than a planar area of the light receiver 132, and the inner sidewalls of the protection layer 775 exposed by the second opening 732 may be spaced apart from the sidewalls of the light receiver 132. In some other embodiments, a bottom planar area of the second opening 732 may be equal to a planar area of the light receiver 132.

An adhesive agent 782 may be disposed on the first solder resist layer 771, and a light transmission layer 784 may be attached to the first solder resist layer 771 using the adhesive agent 782 to cover the second opening 732. In such a case, an empty space may exist between the light transmission layer 784 and the light receiver 132. A second solder resist layer 772 may be disposed on a bottom surface of the second insulation layer 712 to cover the second lower circuit patterns 754 and 755. The second solder resist layer 772 may have openings that expose the second lower circuit patterns 754 and 755, and a plurality of solder balls 790 may be disposed in the openings to contact the second lower circuit patterns 754 and 755.

Figure 4:
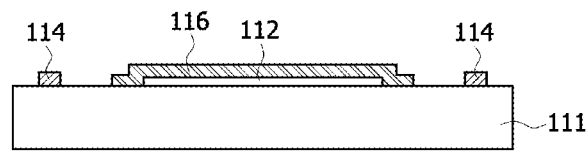
FIGS. 4 to 13 are cross-sectional views illustrating a method of fabricating an embedded image sensor package according to an embodiment.

FIGS. 4 to 13 are cross-sectional views illustrating a method of fabricating an embedded image sensor package according to an embodiment. Referring to FIG. 4, an image sensor chip 111 having a top surface may be provided. A light receiver 112 and connection members 114 may be formed on the top surface of the image sensor chip 111. The connection members 114 may around the light receiver 112. For example, although not shown in the cross-sectional view of FIG. 4, connection members 114 may be disposed on all four sides of the light receiver 112 along the horizontal plane. In some embodiments, the connection members 114 may be formed of metal bumps. Alternatively, the connection members 114 may be formed of conductive pads.

A metal mask 116 may be formed to cover the light receiver 112. The metal mask 116 may be formed to cover a top surface and sidewalls of the light receiver 112. The metal mask 116 may be used as a mask for protecting the light receiver 112 in subsequent process steps. The connection members 114 and the metal mask 116 may be simultaneously formed using the same process. Specifically, a metal layer may be formed on the top surface of the image sensor chip 111 to cover the light receiver 112, and the metal layer may be patterned to form the connection members 114 and the metal mask 116. In such a case, the connection members 114 and the metal mask 116 may be formed of the same material.

Figure 5:
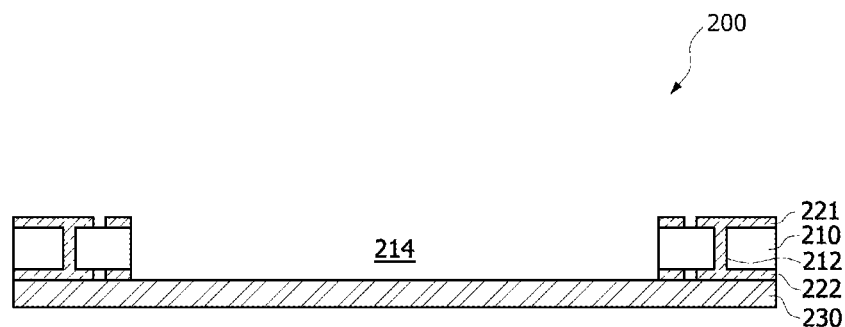

Referring to FIG. 5, a core layer 210 may be attached to a temporary substrate 230 to provide a structure 200. In some embodiments, the temporary substrate 230 may be an adhesive film. The core layer 210 may have a cavity 214 therein. A planar area of the cavity 214 may be greater than a planar area of the image sensor chip (111 of FIG. 4) which is put in the cavity 214 in a subsequent process. Although FIG. 5 illustrates an example which only has a single cavity 214, embodiments of the present disclosure are not limited thereto. For example, in some embodiments, two or more cavities 214 are formed in the core layer 210. In such a case, a plurality of image sensor chips may be respectively embedded in the plurality of cavities 214 of the core layer 210, and the core layer 210 may be divided into a plurality of pieces using a sawing process or the like so that each piece of the core layer 210 includes a single image sensor chip 111.

First upper circuit patterns 221 may be formed on a top surface of the core layer 210, and first lower circuit patterns 222 may be formed on a bottom surface of the core layer 210. The first upper circuit patterns 221 may be electrically connected to the first lower circuit patterns 222 via through electrodes 212 that vertically penetrate the core layer 210. In some embodiments, the temporary substrate 230 may be attached to the first lower circuit patterns 222.

Figure 6:
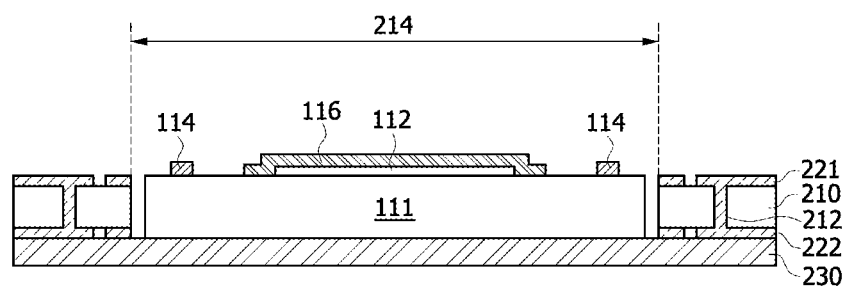

Referring to FIG. 6, the image sensor chip 111 may be attached to a surface of the temporary substrate 230 which is exposed by the cavity 214 of the core layer 210. The image sensor chip 111 may be attached to the temporary substrate 230 so that a bottom surface of the image sensor chip 111 opposite to the connection members 114 and the metal mask 116 is attached to the temporary substrate 230. Accordingly, the connection members 114 and the metal mask 116 may be exposed after the image sensor chip 111 is attached to the temporary substrate 230. Since a planar area of the cavity 214 in the core layer 210 is greater than a planar area of the image sensor chip 111, sidewalls of the core layer exposed by the cavity 214 may be spaced apart from sidewalls of the image sensor chip 111. That is, there may be gaps between the sidewalls of the cavity 214 and the sidewalls of the image sensor chip 111. Surfaces of the first lower circuit patterns 222 may be coplanar with a bottom surface of the image sensor chip 111.

Figure 7:
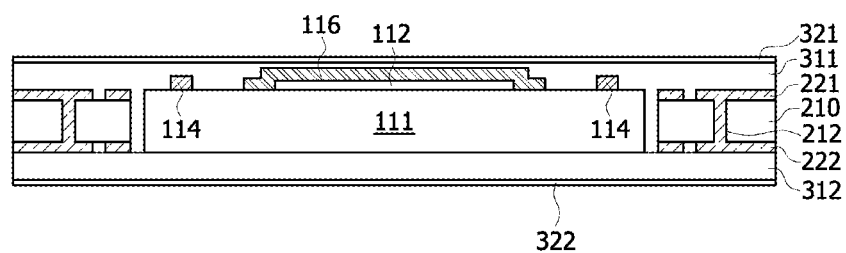

Referring to FIG. 7, a first insulation layer 311 and a second insulation layer 312 may be formed to embed the core layer 210 and the image sensor chip 111 in the first and second insulation layers 311 and 312. Specifically, the first insulation layer 311 may be formed on the top surface of the core layer 210 to cover the first upper circuit patterns 221, the image sensor chip 111, the metal mask 116 and the connection members 114. After the first insulation layer 311 is formed, the temporary substrate 230 may be detached from the image sensor chip 111 and the core layer 210 and the second insulation layer 312 may be formed on the bottom surface of the core layer 210 to cover the first lower circuit patterns 222.

The first insulation layer 311 may be formed by depositing a first insulation material over the top surface of the core layer 210 and by applying heat and pressure to the first insulation material through a lamination process. Similarly, the second insulation layer 312 may also be formed by depositing a second insulation material over the bottom surface of the core layer 210 and by applying heat and pressure to the second insulation material through a lamination process. In some embodiments, the first and second insulation layers 311 and 312 may be formed of the same material.

The first and second insulation layers 311 and 312 may be formed of an insulation material having a relatively low thermal expansion coefficient. For example, each of the first and second insulation layers 311 and 312 may be formed of a polymer resin material that contains inorganic filler, which has a low thermal expansion coefficient relative to an unfilled polymer. The inorganic filler may act as a contamination source to the light receiver 112 of the image sensor chip 111. Thus, it may be necessary to prevent the light receiver 112 from being contaminated while the first and second insulation layers 311 and 312 are formed.

In the present embodiment, because a top surface and sidewalls of the light receiver 112 may be covered by the metal mask 116, the metal mask 116 may prevent the light receiver 112 from being contaminated while the first and second insulation layers 311 and 312 are formed. After the first and second insulation layers 311 and 312 are formed, a first seed layer 321 may be formed on the first insulation layer 311 and a second seed layer 322 may be formed on the second insulation layer 312. In some embodiments, the first and second seed layers 321 and 322 may be formed of a copper layer.

The first and second seed layers 321 and 322 may be applied when metal layers for forming interconnection patterns are grown on the first and second insulation layers 311 and 312 using an electroplating process in a subsequent process step. However, in an embodiment in which other processes are used to form the metal layers, first and second seed layers 321 and 322 may not be formed. For example, if the metal layers for forming interconnection patterns are deposited on the first and second insulation layers 311 and 312 using a deposition process such as a chemical vapor deposition (CVD) process or a physical vapor deposition (PVD) process, it may not be necessary to respectively form the first and second seed layers 321 and 322 on the first and second insulation layers 311 and 312.

Figure 8:
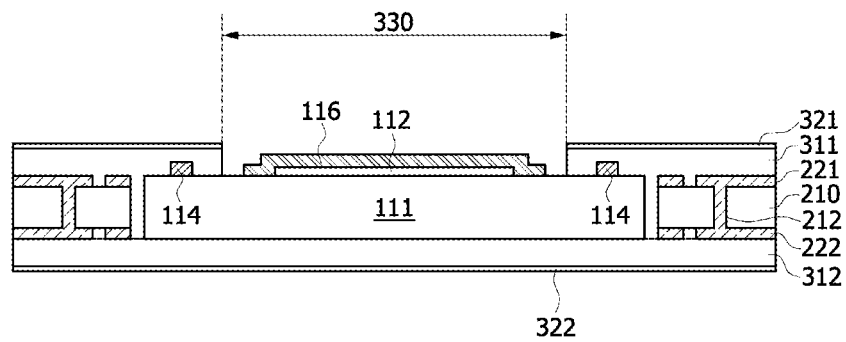

Referring to FIG. 8, the first seed layer 321 and the first insulation layer 311 may be patterned to form a first opening 330 that exposes the metal mask 116. The first opening 330 may define a light receiving area including the light receiver 112. In order to form the first opening 330, a mask pattern such as a photoresist pattern having an opening over the metal mask 116 may be formed on the first seed layer 321, and the first seed layer 321 and the first insulation layer 311 may be sequentially etched using the mask pattern as an etch mask to expose the metal mask 116. After the first opening 330 is formed, the mask pattern may be removed. The first opening 330 may be formed to have a planar area which is greater than a planar area of the metal mask 116. Even after the first insulation layer 311 is etched to form the first opening 330, an entire portion of the light receiver 112 may still be covered with the metal mask 116. Thus, the metal mask 116 may prevent the light receiver 112 from being contaminated by contamination components in the first insulation layer 311.

Figure 9:
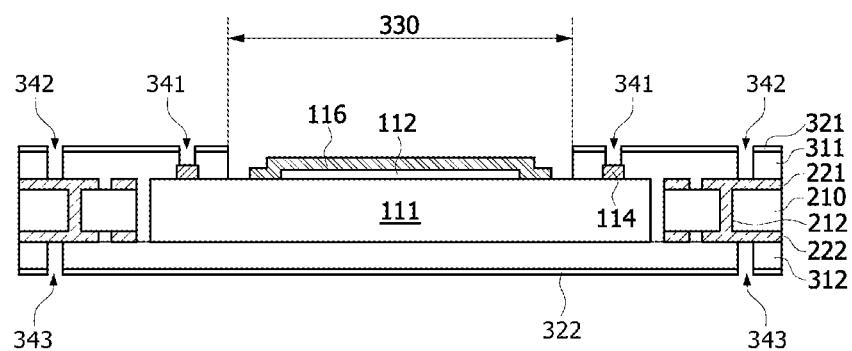

Referring to FIG. 9, the first seed layer 321 and the first insulation layer 311 may be patterned to form first upper via holes 341 exposing the connection members 114 and second upper via holes 342 exposing the first upper circuit patterns 221. In addition, the second seed layer 322 and the second insulation layer 312 may be patterned to form lower via holes 343 exposing the first lower circuit patterns 222. In some embodiments, the first upper via holes 341, the second upper via holes 342 and the lower via holes 343 may be formed using a laser drilling process. In the present embodiment, the first upper via holes 341 and the second upper via holes 342 may be formed after the first opening 330 is formed. However, embodiments of the present disclosure are not limited to this process sequence. For example, in some embodiments, the first opening 330 and the first and the second upper via holes 341 and 342 may be simultaneously formed using a single process. In such a case, the process step for forming the first opening 330 described with reference to FIG. 8 may be omitted, and the first opening 330 may be formed while the first and the second upper via holes 341 and 342 described with reference to FIG. 9 are formed.

Figure 10:
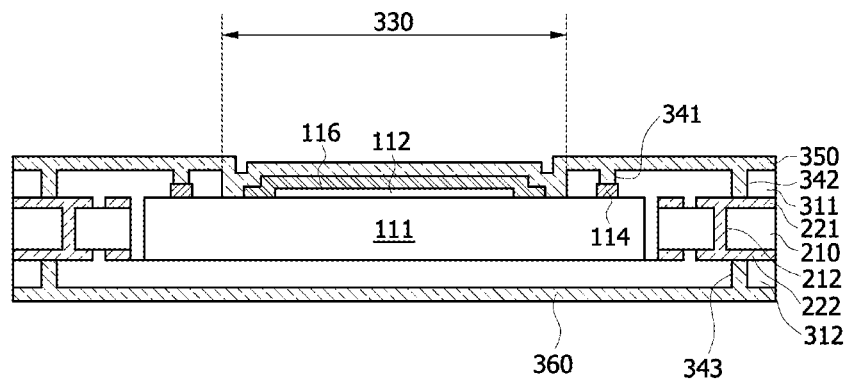

Referring to FIG. 10, a first metal layer 350 may be formed on the first insulation layer 311 and the metal mask 116 and in the first and the second upper via holes 341 and 342 using an electroplating process that employs the first seed layer (321 of FIG. 9) as a seed layer, and a second metal layer 360 may be formed on the second insulation layer 312 and in the lower via holes 343 using an electroplating process that employs the second seed layer (322 of FIG. 9) as a seed layer. The first and second metal layers 350 and 360 may be simultaneously formed using a single electroplating process. The first metal layer 350 may also be formed to fill gaps between sidewalls of the first insulation layer 311 exposed by the first opening 330 and sidewalls of the metal mask 116. While the first and second metal layers 350 and 360 are formed, the light receiver 112 may still be covered with the metal mask 116. Thus, the metal mask 116 may prevent the light receiver 112 from being contaminated by contamination components in the first insulation layer 311 even while the first and second metal layers 350 and 360 are formed. The first metal layer 350 and the second metal layer 360 may be simultaneously formed using a single electroplating process.

Figure 11:
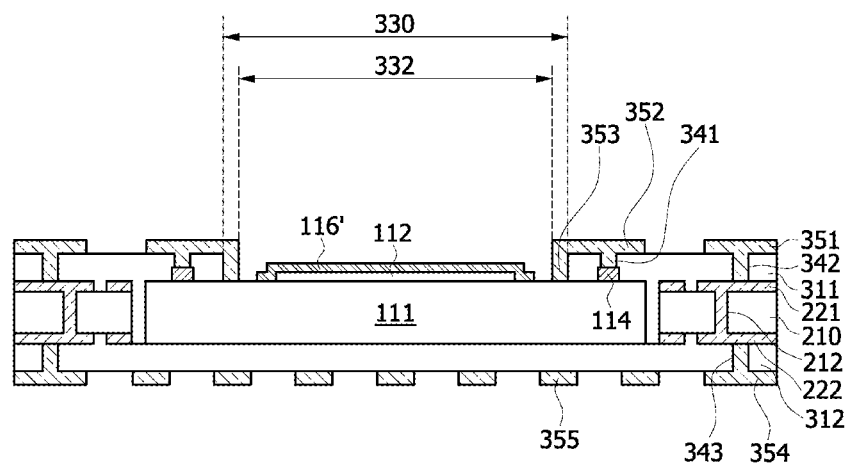

Referring to FIG. 11, the first metal layer (350 of FIG. 10) may be patterned to form second upper circuit patterns 351 and 352 and a protection layer 353. The pattering process applied to the first metal layer (350 of FIG. 10) may affect the metal mask (116 of FIG. 10) covering the light receiver 112. That is, a thickness of the metal mask (116 of FIG. 10) may be reduced while the first metal layer (350 of FIG. 10) is patterned. Accordingly, a metal mask 116', which is thinner than the initial metal mask (116 of FIG. 10), may still exist on the light receiver 112 after the second upper circuit patterns 351 and 352 and the protection layer 353 are formed.

The second upper circuit patterns 351 may be formed to be electrically connected to the first upper circuit patterns 221 through the second upper via holes 342. The second upper circuit patterns 352 may be formed to be electrically connected to the connection members 114 through the first upper via holes 341. The protection layer 353 may be formed on sidewalls of the second upper circuit patterns 352 and the first insulation layer 311 which are exposed by the first opening 330. A lower portion of the protection layer 353 may be formed to contact the top surface of the image sensor chip 111. Accordingly, the protection layer 353 may be disposed between the light receiver 112 and first insulation layer 311.

Although not shown in the cross-sectional view of FIG. 11, the protection layer 353 may be formed to cover all of the sidewalls of first insulation layer 311 which are exposed by the first opening 330. Thus, all of the sidewalls of the light receiver 112 may be surrounded by the protection layer 353. An inner sidewall of the protection layer 353 may define a second opening 332 having a width which is less than a width of the first opening 330. The protection layer 353 may also prevent the light receiver 112 from being contaminated by contamination components in the first insulation layer 311 in the following process steps. The protection layer 353 may be formed while the second upper circuit patterns 351 and 352 are formed. Therefore, an additional process step for forming only the protection layer 353 may not be required. After the second upper circuit patterns 351 and 352 and the protection layer 353 are formed, the second metal layer (360 of FIG. 10) may be patterned to form second lower circuit patterns 354 and 355. The second lower circuit patterns 354 may be formed to be electrically connected to the first lower circuit patterns 222 through the lower via holes 343.

Although the present embodiment describes an example in which the first and second metal layers 350 and 360 are formed using an electroplating process and the first and second metal layers 350 and 360 are then patterned to form the circuit patterns 351, 352, 354 and 355 and the protection layer 353, embodiments of the present disclosure are not limited thereto. For example, in some embodiments, after the first and second seed layers (321 and 322 of FIG. 9) are patterned, the circuit patterns 351, 352, 354 and 355 and the protection layer 353 may be formed using an electroplating process.

Figure 12:
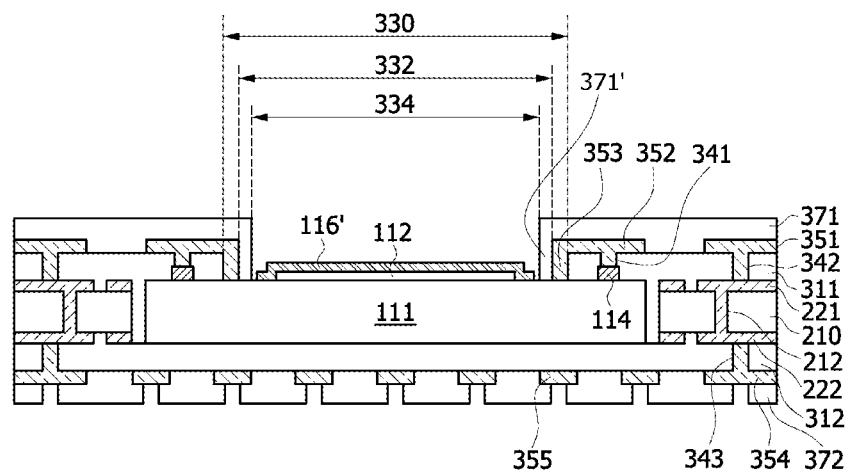

Referring to FIG. 12, a first solder resist layer 371 may be formed on a top surface of the first insulation layer 311 to cover the second upper circuit patterns 351 and 352 and the protection layer 353. The first solder resist layer 371 may also be formed to cover the inner sidewalls of the protection layer 353 exposed by the second opening 332. In such a case, a third opening 334, which is narrower than the second opening 332, may be defined by inner sidewalls of the first solder resist layer 371. In addition, a second solder resist layer 372 may be formed on a bottom surface of the second insulation layer 312 to cover the second lower circuit patterns 354 and 355. The second solder resist layer 372 may be formed to have openings that expose the second lower circuit patterns 354 and 355.

Figure 13:
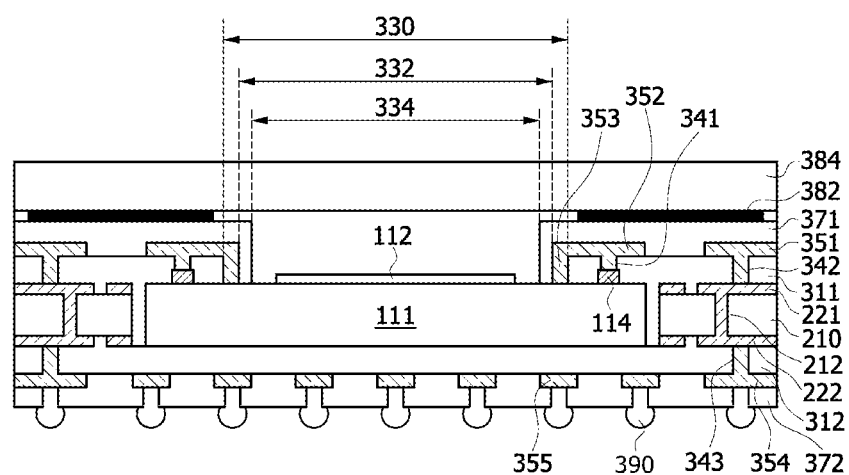

Referring to FIG. 13, after forming the first and second solder resist layers 371 and 372, the metal mask (116 of FIG. 12) may be removed. While the metal mask (116 of FIG. 12) is removed, the second upper circuit patterns 351 and 352 and the protection layer 353 may still be covered with the first solder resist layer 371. Thus, the first solder resist layer 371 may prevent the second upper circuit patterns 351 and 352 and the protection layer 353 from being damaged while the metal mask (116 of FIG. 12) is removed. Meanwhile, the second lower circuit patterns 354 and 355 may be exposed by the openings of the second solder resist layer 372 while the metal mask (116 of FIG. 12) is removed. Accordingly, the second lower circuit patterns 354 and 355 may be formed of a metal material having a high etch selectivity with respect to the metal mask (116 of FIG. 12) to minimize damage to the second lower circuit patterns 354 and 355 while the metal mask (116 of FIG. 12) is removed.

After removal of the metal mask (116 of FIG. 12), an adhesive agent 382 may be supplied onto the first solder resist layer 371. A light transmission layer 384 may be attached to the first solder resist layer 371 using the adhesive agent 382. As a result, the third opening 334 may be covered with the light transmission layer 384. Subsequently, external connection terminals 390, for example, solder balls may be formed in respective openings of the second solder resist layer 372.

Figure 14:
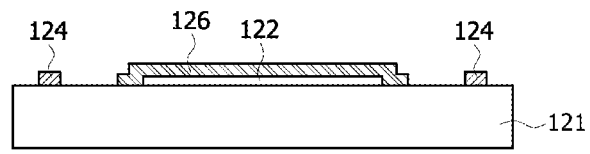
FIGS. 14 to 23 are cross-sectional views illustrating a method of fabricating an embedded image sensor package according to another embodiment.

FIGS. 14 to 23 are cross-sectional views illustrating a method of fabricating an embedded image sensor package according to another embodiment. Referring to FIG. 14, an image sensor chip 121 having a top surface may be provided. A light receiver 122 and connection members 124 may be formed on the top surface of the image sensor chip 121. The connection members 124 may be formed to surround the light receiver 122. In some embodiments, the connection members 124 may be formed of metal bumps. Alternatively, the connection members 124 may be formed of conductive pads. A metal mask 126 may be formed to cover the light receiver 122. The metal mask 126 may be formed to cover a top surface and sidewalls of the light receiver 122. The metal mask 126 may be used as a mask for protecting the light receiver 122 in subsequent process steps. The connection members 124 and the metal mask 126 may be simultaneously formed using the same process. Specifically, a metal layer may be formed on the top surface of the image sensor chip 121 to cover the light receiver 122, and the metal layer may be patterned to form the connection members 124 and the metal mask 126. In such a case, the connection members 124 and the metal mask 126 may be formed of the same material.

Figure 15:
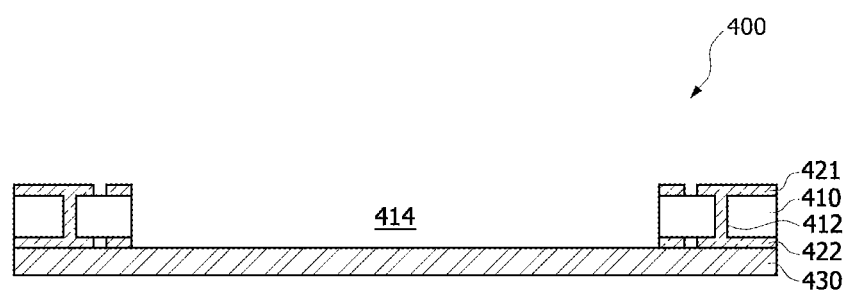

Referring to FIG. 15, a core layer 410 may be attached to a temporary substrate 430 to provide a structure 400. In some embodiments, the temporary substrate 430 may be an adhesive film. The core layer 410 may have a cavity 414 therein. A planar area of the cavity 414 may be greater than a planar area of the image sensor chip (121 of FIG. 14) which is put in the cavity 414 in a subsequent process. Although FIG. 15 illustrates an example which only has a single cavity 414, embodiments of the present disclosure are not limited thereto. For example, in some embodiments, two or more cavities 414 are formed in the core layer 410. In such a case, a plurality of image sensor chips may be respectively embedded in the plurality of cavities 414 of the core layer 410, and the core layer 410 may be divided into a plurality of pieces using a sawing process or the like so that each piece of the core layer 410 includes a single image sensor chip 121.

First upper circuit patterns 421 may be formed on a top surface of the core layer 410, and first lower circuit patterns 422 may be formed on a bottom surface of the core layer 410. The first upper circuit patterns 421 may be electrically connected to the first lower circuit patterns 422 via through electrodes 412 that vertically penetrate the core layer 410. In some embodiments, the temporary substrate 430 may be attached to the first lower circuit patterns 422.

Figure 16:
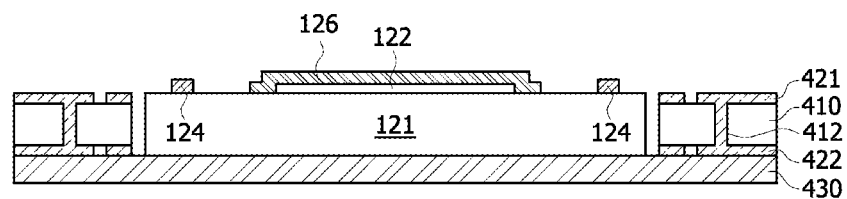

Referring to FIG. 16, the image sensor chip 121 may be attached to a surface of the temporary substrate 430 which is exposed by the cavity 414 of the core layer 410. The image sensor chip 121 may be attached to the temporary substrate 430 so that a bottom surface of the image sensor chip 121 opposite to the connection members 124 and the metal mask 126 is attached to the temporary substrate 430. Accordingly, the connection members 124 and the metal mask 126 may be exposed after the image sensor chip 121 is attached to the temporary substrate 430. Since a planar area of the cavity 414 in the core layer 410 is greater than a planar area of the image sensor chip 121, sidewalls of the core layer exposed by the cavity 414 may be spaced apart from sidewalls of the image sensor chip 121. That is, there may be gaps between the sidewalls of the cavity 414 and the sidewalls of the image sensor chip 121. Surfaces of the first lower circuit patterns 422 may be coplanar with a bottom surface of the image sensor chip 121.

Figure 17:
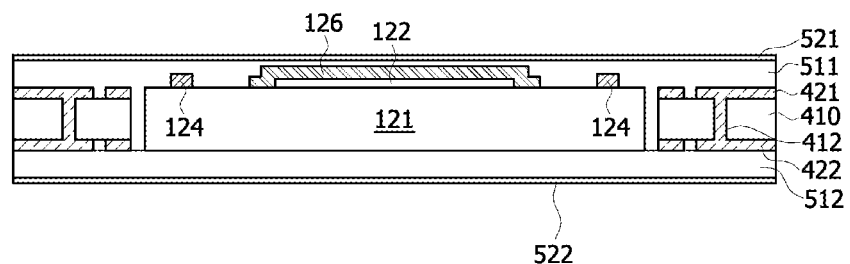

Referring to FIG. 17, a first insulation layer 511 and a second insulation layer 512 may be formed to embed the core layer 410 and the image sensor chip 121 in the first and second insulation layers 511 and 512. Specifically, the first insulation layer 511 may be formed on the top surface of the core layer 410 to cover the first upper circuit patterns 421, the image sensor chip 121, the metal mask 126 and the connection members 124. After the first insulation layer 511 is formed, the temporary substrate 430 may be detached from the image sensor chip 121 and the core layer 410 and the second insulation layer 512 may be formed on the bottom surface of the core layer 410 to cover the first lower circuit patterns 422.

The first insulation layer 511 may be formed by depositing a first insulation material over the top surface of the core layer 410 and applying heat and pressure to the first insulation material through a lamination process. Similarly, the second insulation layer 512 may also be formed by depositing a second insulation material over the bottom surface of the core layer 410 and by applying heat and pressure to the second insulation material through a lamination process. In some embodiments, the first and second insulation layers 511 and 512 may be formed of the same material. The first and second insulation layers 511 and 512 may be formed of an insulation material having a relatively low thermal expansion coefficient. For example, each of the first and second insulation layers 511 and 512 may be formed of a polymer resin material that contains inorganic filler, which has a low thermal expansion coefficient relative to an unfilled polymer.

The inorganic filler may act as a contamination source to the light receiver 122 of the image sensor chip 121. Thus, it may be necessary to prevent the light receiver 122 from being contaminated while the first and second insulation layers 511 and 512 are formed. In the present embodiment, because a top surface and sidewalls of the light receiver 122 may be covered by the metal mask 126, the metal mask 126 may prevent the light receiver 122 from being contaminated while the first and second insulation layers 511 and 512 are formed.

After the first and second insulation layers 511 and 512 are formed, a first seed layer 521 may be formed on the first insulation layer 511 and a second seed layer 522 may be formed on the second insulation layer 512. In some embodiments, the first and second seed layers 521 and 522 may be formed of a copper layer. The first and second seed layers 521 and 522 may be applied when metal layers for forming interconnection patterns are grown on the first and second insulation layers 511 and 512 using an electroplating process in a subsequent process step. However, in an embodiment in which other processes are used to form the metal layers, first and second seed layers 521 and 522 may not be formed. For example, if the metal layers for forming interconnection patterns are deposited on the first and second insulation layers 511 and 512 using a deposition process such as a chemical vapor deposition (CVD) process or a physical vapor deposition (PVD) process, it may not be necessary to respectively form the first and second seed layers 521 and 522 on the first and second insulation layers 511 and 512.

Figure 18:
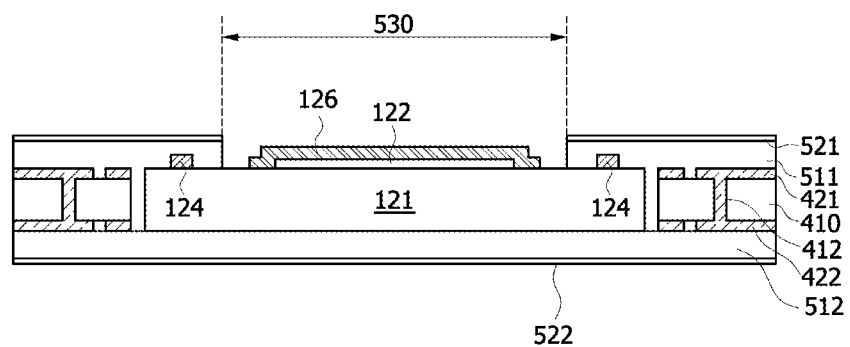

Referring to FIG. 18, the first seed layer 521 and the first insulation layer 511 may be patterned to form a first opening 530 that exposes the metal mask 126. The first opening 530 may define a light receiving area including the light receiver 122. In order to form the first opening 530, a mask pattern such as a photoresist pattern having an opening over the metal mask 126 may be formed on the first seed layer 521, and the first seed layer 521 and the first insulation layer 511 may be sequentially etched using the mask pattern as an etch mask to expose the metal mask 126. After the first opening 530 is formed, the mask pattern may be removed. The first opening 530 may be formed to have a planar area which is greater than a planar area of the metal mask 126. Even after the first insulation layer 511 is etched to form the first opening 530, an entire portion of the light receiver 122 may still be covered with the metal mask 126. Thus, the metal mask 126 may prevent the light receiver 122 from being contaminated by contamination components in the first insulation layer 511.

Figure 19:
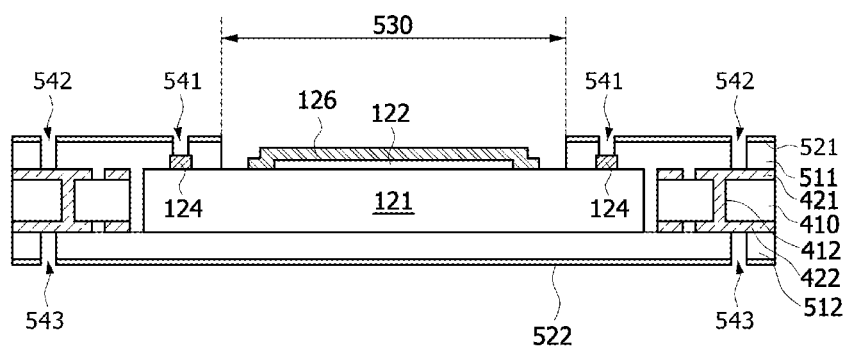

Referring to FIG. 19, the first seed layer 521 and the first insulation layer 511 may be patterned to form first upper via holes 541 exposing the connection members 124 and second upper via holes 542 exposing the first upper circuit patterns 421. In addition, the second seed layer 522 and the second insulation layer 512 may be patterned to form lower via holes 543 exposing the first lower circuit patterns 422. In some embodiments, the first upper via holes 541, the second upper via holes 542 and the lower via holes 543 may be formed using a laser drilling process. In the present embodiment, the first upper via holes 541 and the second upper via holes 542 may be formed after the first opening 530 is formed. However, embodiments of the present disclosure are not limited to this process sequence. For example, in some embodiments, the first opening 530 and the first and the second upper via holes 541 and 542 may be simultaneously formed using a single process. In such a case, the process step for forming the first opening 530 described with reference to FIG. 18 may be omitted, and the first opening 530 may be formed while the first and the second upper via holes 541 and 542 described with reference to FIG. 19 are formed.

Figure 20:
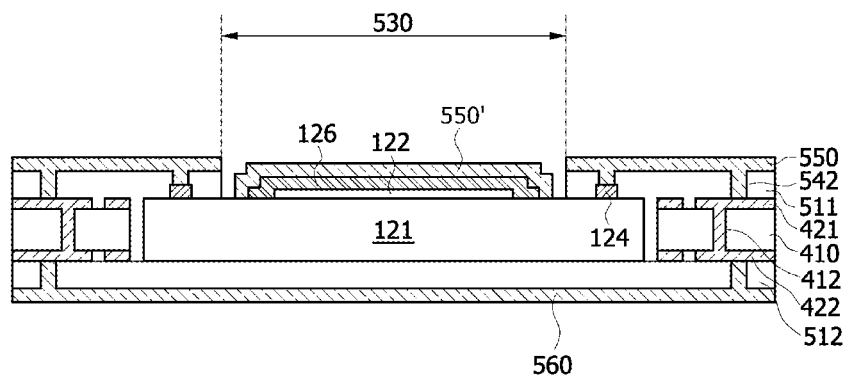

Referring to FIG. 20, a first metal layer 550 may be formed on the first insulation layer 511 and the metal mask 126 and in the first and the second upper via holes 541 and 542 using an electroplating process that employs the first seed layer (521 of FIG. 19) as a seed layer, and a second metal layer 560 may be formed on the second insulation layer 512 and in the lower via holes 543 using an electroplating process that employs the second seed layer (522 of FIG. 19) as a seed layer. Moreover, a dummy metal layer 550' may also be formed on the metal mask 126 while the first metal layer 550 is formed.

In the present embodiment, while the first metal layer 550 and the dummy metal layer 550' are formed by an electroplating process, no metal layer is formed on the sidewalls of the first insulation layer 511 exposed by the first opening 530. This may be controlled by adjusting a process time of the electroplating process for growing the first metal layer 550 and the dummy metal layer 550'. That is, the first metal layer 550 may be formed so that it does not extend onto the sidewalls of the first insulation layer 511 exposed by the first opening 530, and the dummy metal layer 550' may also be formed so that it does not reach the sidewalls of the first insulation layer 511 exposed by the first opening 530. In some embodiments, a cleaning process may be performed after the electroplating process for forming the first metal layer 550 and the dummy metal layer 550'. The first metal layer 550, the dummy metal layer 550' and the second metal layer 560 may be simultaneously formed using a single electroplating process.

Figure 21:
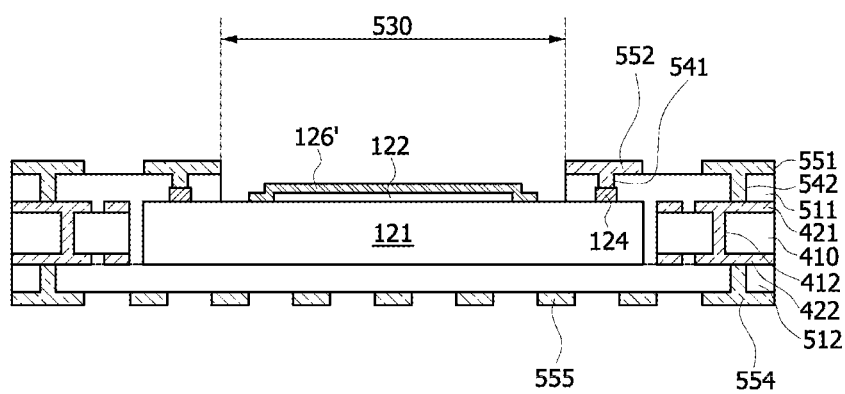

Referring to FIG. 21, the first metal layer (550 of FIG. 20) may be patterned to form second upper circuit patterns 551 and 552 and to remove the dummy metal layer 550' on the metal mask 126. The pattering process for forming the second upper circuit patterns 551 and 552 may affect the metal mask 126 covering the light receiver 122. That is, a thickness of the metal mask 126 may be reduced while the first metal layer (550 of FIG. 20) is patterned to remove the dummy metal layer 550'. Accordingly, the light receiver 122 may still be covered with a metal mask 126' which is thinner than the initial metal mask (126 of FIG. 20) even after the second upper circuit patterns 551 and 552 are formed and the dummy metal layer 550' is removed.

The second upper circuit patterns 551 may be formed to be electrically connected to the first upper circuit patterns 421 through the second upper via holes 542. The second upper circuit patterns 552 may be formed to be electrically connected to the connection members 124 through the first upper via holes 541. After the second upper circuit patterns 551 and 552 are formed, the second metal layer (560 of FIG. 20) may be patterned to form second lower circuit patterns 554 and 555. The second lower circuit patterns 554 may be formed to be electrically connected to the first lower circuit patterns 422 through the lower via holes 543.

Although the present embodiment describes an example in which the first and second metal layers 550 and 560 are formed using an electroplating process and the first and second metal layers 550 and 560 are then patterned to form the circuit patterns 551, 552, 554 and 555, embodiments of the present disclosure are not limited thereto. For example, in some embodiments, after the first and second seed layers (521 and 522 of FIG. 19) are patterned, the circuit patterns 551, 552, 554 and 555 may be formed using an electroplating process.

Figure 22:
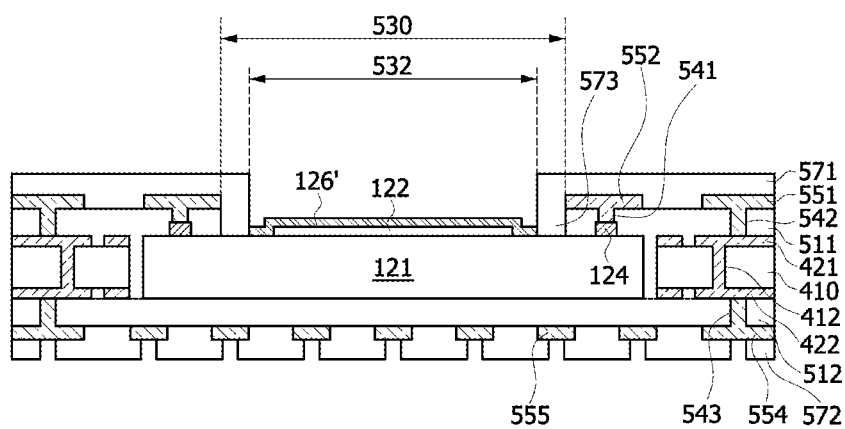

Referring to FIG. 22, a first solder resist layer 571 and a protection layer 573 may be formed. The first solder resist layer 571 may be formed on a top surface of the first insulation layer 511 to cover the second upper circuit patterns 551 and 552, and the protection layer 573 may be formed to extend from the first solder resist layer 571 onto the sidewalls of the second upper circuit patterns 552 and the first insulation layer 511 which are exposed by the first opening 530. In addition, a second solder resist layer 572 may be formed on a bottom surface of the second insulation layer 512 to cover the second lower circuit patterns 554 and 555. The second solder resist layer 572 may be formed to have openings that expose the second lower circuit patterns 554 and 555. Inner sidewalls of the protection layer 573 may define a second opening 532 that exposes the metal mask 126' covering the light receiver 122. The protection layer 573 may prevent the light receiver 122 from being contaminated by contamination components in the first insulation layer 511 in the following process steps. The protection layer 573 may be formed while the first solder resist layer 571 is formed. Therefore, an additional process step for forming only the protection layer 573 may not be required.

Figure 23:
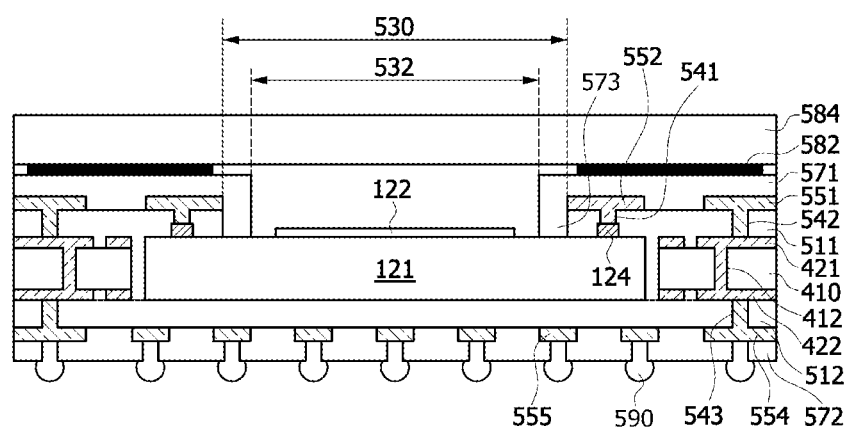

Referring to FIG. 23, after forming the first and second solder resist layers 571 and 572 and the protection layer 573, the metal mask (126' of FIG. 22) may be removed. While the metal mask (126' of FIG. 22) is removed, the second upper circuit patterns 551 and 552 may still be covered with the first solder resist layer 571. Thus, the first solder resist layer 571 may prevent the second upper circuit patterns 551 and 552 from being etched or damaged while the metal mask (126' of FIG. 22) is removed. Meanwhile, the second lower circuit patterns 554 and 555 may be exposed by the openings of the second solder resist layer 572 while the metal mask (126' of FIG. 22) is removed. Accordingly, the second lower circuit patterns 554 and 555 may be formed of a metal material having a high etch selectivity with respect to the metal mask (126' of FIG. 22) to minimize damage to the second lower circuit patterns 554 and 555 while the metal mask (126' of FIG. 22) is removed. After removal of the metal mask (126' of FIG. 22), an adhesive agent 582 may be supplied onto the first solder resist layer 571. A light transmission layer 584 may be attached to the first solder resist layer 571 using the adhesive agent 582. As a result, the second opening 532 may be covered with the light transmission layer 584. Subsequently, external connection terminals 590, for example, solder balls may be formed in respective openings of the second solder resist layer 572.

Figure 24:
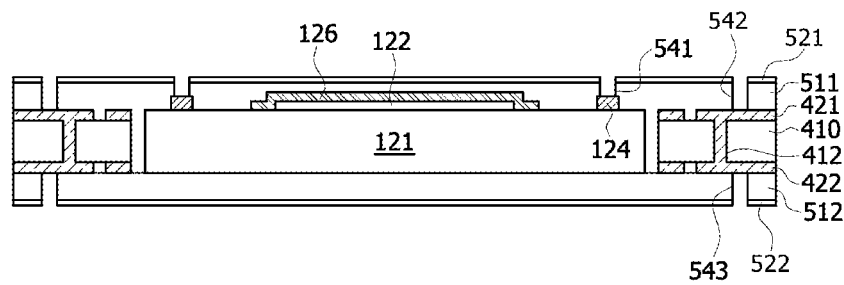
FIGS. 24 to 29 are cross-sectional views illustrating a method of fabricating an embedded image sensor package according to yet another embodiment.

FIGS. 24 to 29 are cross-sectional views illustrating a method of fabricating an embedded image sensor package according to yet another embodiment. A method of fabricating an embedded image sensor package according to the present embodiment may utilize the same processes as described with reference to FIGS. 14 to 17. Thus, descriptions of the same processes as described with reference to FIGS. 14 to 17 will be omitted or briefly mentioned in the present embodiment. The same components as described with reference to FIGS. 14 to 17 are indicated by the same reference numerals or the same reference designators. Referring to FIG. 24, the first and second seed layers 521 and 522 may be finally formed in the same manner as described with reference to FIGS. 14 to 17. The first seed layer 521 and the first insulation layer 511 may be patterned to form the first upper via holes 541 exposing the connection members 124 and the second upper via holes 542 exposing the first upper circuit patterns 421. In addition, the second seed layer 522 and the second insulation layer 512 may be patterned to form the lower via holes 543 exposing the first lower circuit patterns 422. In some embodiments, the first upper via holes 541, the second upper via holes 542 and the lower via holes 543 may be formed using a laser drilling process.

Figure 25:
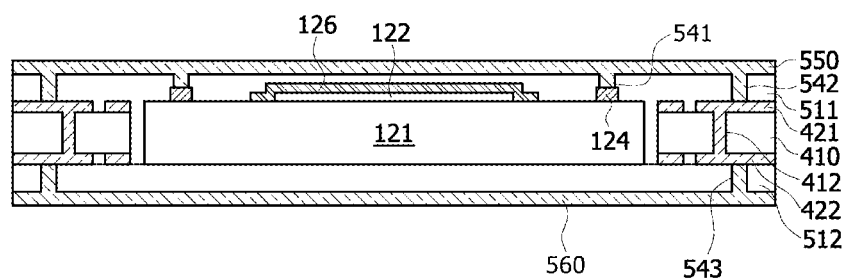

Referring to FIG. 25, the first metal layer 550 may be formed on the first insulation layer 511 and in the first and second upper via holes 541 and 542 using an electroplating process that employs the first seed layer (521 of FIG. 24) as a seed layer, and the second metal layer 560 may be formed on the second insulation layer 512 and in the lower via holes 543 using an electroplating process that employs the second seed layer (522 of FIG. 24) as a seed layer. In some embodiments, the first and second metal layers 550 and 560 may be simultaneously formed using a single electroplating process.

Figure 26:
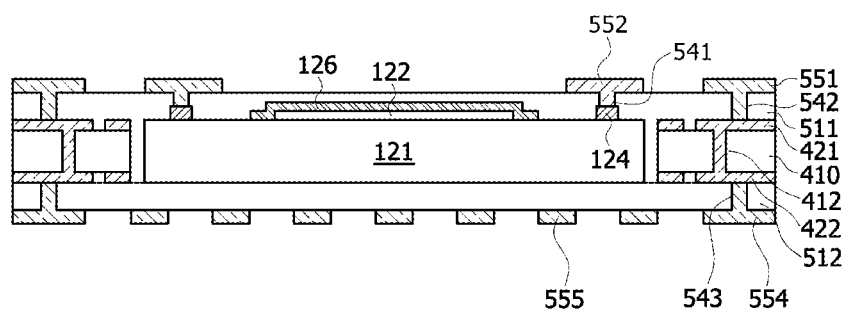

Referring to FIG. 26, the first metal layer (550 of FIG. 25) may be patterned to form second upper circuit patterns 551 and 552. The second upper circuit patterns 551 may be formed to be electrically connected to the first upper circuit patterns 421 through the second upper via holes 542. The second upper circuit patterns 552 may be formed to be electrically connected to the connection members 124 through the first upper via holes 541. The second metal layer (560 of FIG. 25) may be patterned to form the second lower circuit patterns 554 and 555. The second lower circuit patterns 554 may be formed to be electrically connected to the first lower circuit patterns 422 through the lower via holes 543.

Figure 27:
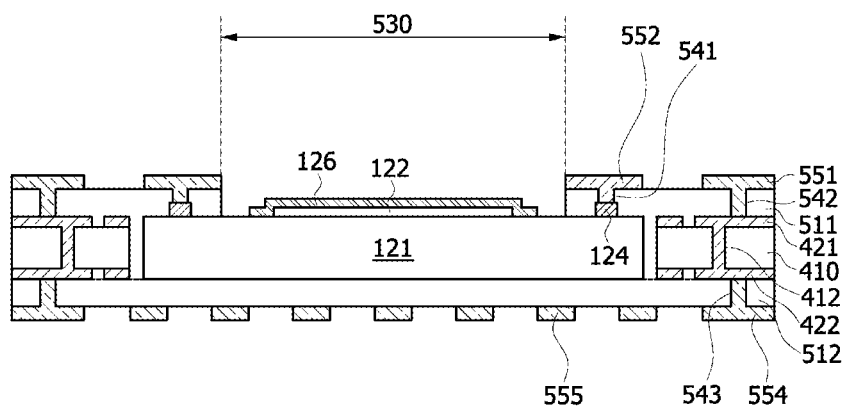

Referring to FIG. 27, the first insulation layer 511 may be patterned to form the first opening 530 that exposes the metal mask 126. The first opening 530 may define a light receiving area including the light receiver 122. In order to form the first opening 530, a mask pattern such as a photoresist pattern having an opening over the metal mask 126 may be formed on the first insulation layer 511, and the first insulation layer 511 may be etched using the mask pattern as an etch mask to expose the metal mask 126. After the first opening 530 is formed, the mask pattern may be removed. The first opening 530 may be formed to have a planar area which is greater than a planar area of the metal mask 126. Even after the first insulation layer 511 is etched to form the first opening 530, an entire portion of the light receiver 122 may still be covered with the metal mask 126.

Figure 28:
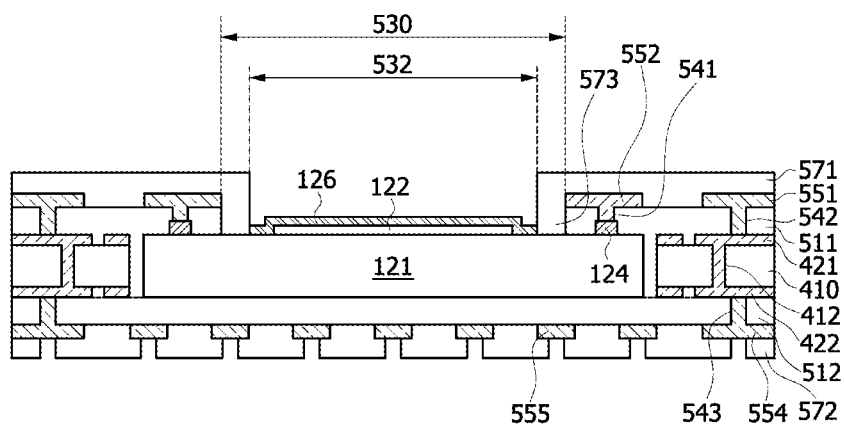

Referring to FIG. 28, the first solder resist layer 571 and the protection layer 573 may be formed. The first solder resist layer 571 may be formed on a top surface of the first insulation layer 511 to cover the second upper circuit patterns 551 and 552, and the protection layer 573 may be formed to extend from the first solder resist layer 571 onto the sidewalls of the second upper circuit patterns 552 and the first insulation layer 511 which are exposed by the first opening 530. In addition, the second solder resist layer 572 may be formed on a bottom surface of the second insulation layer 512 to cover the second lower circuit patterns 554 and 555. The second solder resist layer 572 may be formed to have openings that expose the second lower circuit patterns 554 and 555.

Inner sidewalls of the protection layer 573 may define the second opening 532 that exposes the metal mask 126 covering the light receiver 122. The protection layer 573 may prevent the light receiver 122 from being contaminated by contamination components in the first insulation layer 511 in the following process steps. The protection layer 573 may be formed while the first solder resist layer 571 is formed. Therefore, an additional process step for forming only the protection layer 573 may not be required.

Figure 29:
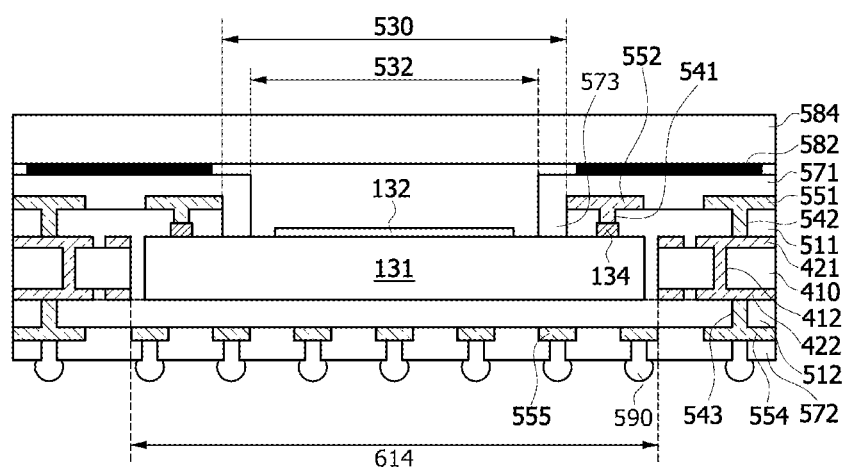

Referring to FIG. 29, after forming the first and second solder resist layers 571 and 572 and the protection layer 573, the metal mask (126 of FIG. 28) may be removed. While the metal mask (126 of FIG. 28) is removed, the second upper circuit patterns 551 and 552 may still be covered with the first solder resist layer 571. Thus, the first solder resist layer 571 may prevent the second upper circuit patterns 551 and 552 from being etched or damaged while the metal mask (126 of FIG. 28) is removed. Meanwhile, the second lower circuit patterns 554 and 555 may be exposed by the openings of the second solder resist layer 572 while the metal mask (126 of FIG. 28) is removed. Accordingly, the second lower circuit patterns 554 and 555 may be formed of a metal material having a high etch selectivity with respect to the metal mask (126 of FIG. 28) to minimize damage to the second lower circuit patterns 554 and 555 while the metal mask (126 of FIG. 28) is removed. After removal of the metal mask (126 of FIG. 28), the adhesive agent 582 may be supplied onto the first solder resist layer 571. The light transmission layer 584 may be attached to the first solder resist layer 571 using the adhesive agent 582. As a result, the second opening 532 may be covered with the light transmission layer 584. Subsequently, external connection terminals 590, for example, solder balls may be formed in respective openings of the second solder resist layer 572.

Figure 30:
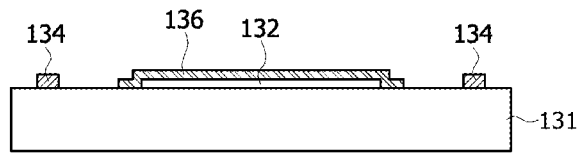
FIGS. 30 to 39 are cross-sectional views illustrating a method of fabricating an embedded image sensor package according to still another embodiment.

FIGS. 30 to 39 are cross-sectional views illustrating a method of fabricating an embedded image sensor package according to still another embodiment. Referring to FIG. 30, an image sensor chip 131 having a top surface may be provided. A light receiver 132 and connection members 134 may be formed on the top surface of the image sensor chip 131. The connection members 134 may be formed to surround the light receiver 132. In some embodiments, the connection members 134 may be formed of metal bumps. Alternatively, the connection members 134 may be formed of conductive pads.

A metal mask 136 may be formed to cover the light receiver 132. The metal mask 136 may be formed to cover a top surface and sidewalls of the light receiver 132. The metal mask 136 may be used as a mask for protecting the light receiver 132 in subsequent process steps. The connection members 134 and the metal mask 136 may be simultaneously formed using the same process. Specifically, a metal layer may be formed on the top surface of the image sensor chip 131 to cover the light receiver 132, and the metal layer may be patterned to form the connection members 134 and the metal mask 136. In such a case, the connection members 134 and the metal mask 136 may be formed of the same material.

Figure 31:
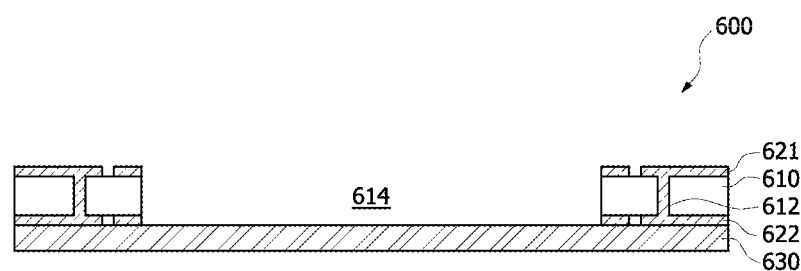

Referring to FIG. 31, a core layer 610 may be attached to a temporary substrate 630 to provide a structure 600. In some embodiments, the temporary substrate 630 may be an adhesive film. The core layer 610 may have a cavity 614 therein. A planar area of the cavity 614 may be greater than a planar area of the image sensor chip (131 of FIG. 30) which is put in the cavity 614 in a subsequent process. Although FIG. 31 illustrates an example in which includes a single cavity 614, embodiments of the present disclosure are not limited thereto. For example, in some embodiments, two or more cavities 614 are formed in the core layer 610. In such a case, a plurality of image sensor chips may be respectively embedded in the plurality of cavities 614 of the core layer 610, and the core layer 610 may be divided into a plurality of pieces using a sawing process or the like so that each piece of the core layer 610 includes a single image sensor chip 131.

First upper circuit patterns 621 may be formed on a top surface of the core layer 610, and first lower circuit patterns 622 may be formed on a bottom surface of the core layer 610. The first upper circuit patterns 621 may be electrically connected to the first lower circuit patterns 622 via through electrodes 612 that vertically penetrate the core layer 610. In some embodiments, the temporary substrate 630 may be attached to the first lower circuit patterns 622.

Figure 32:
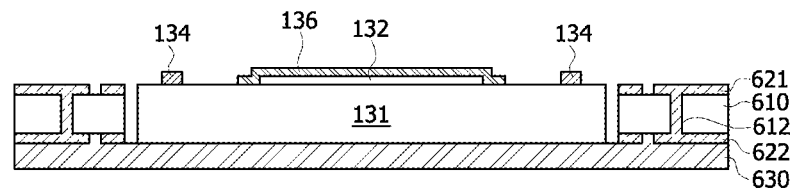

Referring to FIG. 32, the image sensor chip 131 may be attached to a surface of the temporary substrate 630 which is exposed by the cavity 614 of the core layer 610. The image sensor chip 131 may be attached to the temporary substrate 630 so that a bottom surface of the image sensor chip 131 opposite to the connection members 134 and the metal mask 136 is attached to the temporary substrate 630. Accordingly, the connection members 134 and the metal mask 136 may be exposed after the image sensor chip 131 is attached to the temporary substrate 630. Since a planar area of the cavity 614 in the core layer 610 is greater than a planar area of the image sensor chip 131, sidewalls of the core layer exposed by the cavity 614 may be spaced apart from sidewalls of the image sensor chip 131. That is, there may be gaps between the sidewalls of the cavity 614 and the sidewalls of the image sensor chip 131. Surfaces of the first lower circuit patterns 622 may be coplanar with a bottom surface of the image sensor chip 131.

Figure 33:
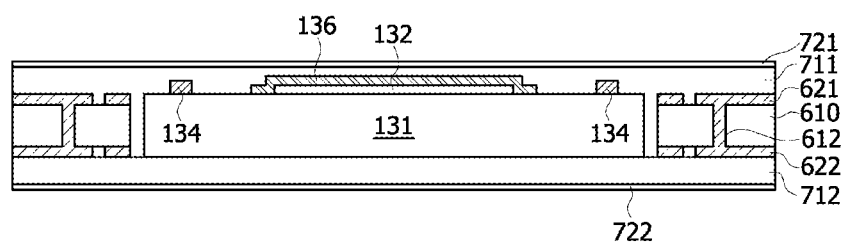

Referring to FIG. 33, a first insulation layer 711 and a second insulation layer 712 may be formed to embed the core layer 610 and the image sensor chip 131 in the first and second insulation layers 711 and 712. Specifically, the first insulation layer 711 may be formed on the top surface of the core layer 610 to cover the first upper circuit patterns 621, the image sensor chip 131, the metal mask 136 and the connection members 134. After the first insulation layer 711 is formed, the temporary substrate 630 may be detached from the image sensor chip 131 and the core layer 610 and the second insulation layer 712 may be formed on the bottom surface of the core layer 610 to cover the first lower circuit patterns 622.

The first insulation layer 711 may be formed by depositing a first insulation material over the top surface of the core layer 610 and by applying heat and pressure to the first insulation material through a lamination process. Similarly, the second insulation layer 712 may also be formed by depositing a second insulation material over the bottom surface of the core layer 610 and by applying heat and pressure to the second insulation material through a lamination process. In some embodiments, the first and second insulation layers 711 and 712 may be formed of the same material.

The first and second insulation layers 711 and 712 may be formed of an insulation material having a relatively low thermal expansion coefficient. For example, each of the first and second insulation layers 711 and 712 may be formed of a polymer resin material that contains inorganic filler, which has a low thermal expansion coefficient relative to an unfilled polymer. The inorganic filler may act as a contamination source to the light receiver 132 of the image sensor chip 131. Thus, it may be necessary to prevent the light receiver 132 from being contaminated while the first and second insulation layers 711 and 712 are formed. In the present embodiment, because a top surface and sidewalls of the light receiver 132 may be covered by the metal mask 136, the metal mask 136 may prevent the light receiver 132 from being contaminated while the first and second insulation layers 711 and 712 are formed.

After the first and second insulation layers 711 and 712 are formed, a first seed layer 721 may be formed on the first insulation layer 711 and a second seed layer 722 may be formed on the second insulation layer 712. In some embodiments, the first and second seed layers 721 and 722 may be formed of a copper layer. The first and second seed layers 721 and 722 may be applied when metal layers for forming interconnection patterns are grown on the first and second insulation layers 711 and 712 using an electroplating process in a subsequent process step. However, in an embodiment in which other processes are used to form the metal layers, first and second seed layers 721 and 722 may not be formed. For example, if the metal layers for forming interconnection patterns are deposited on the first and second insulation layers 711 and 712 using a deposition process such as a chemical vapor deposition (CVD) process or a physical vapor deposition (PVD) process, it may not be necessary to respectively form the first and second seed layers 721 and 722 on the first and second insulation layers 711 and 712.

Figure 34:
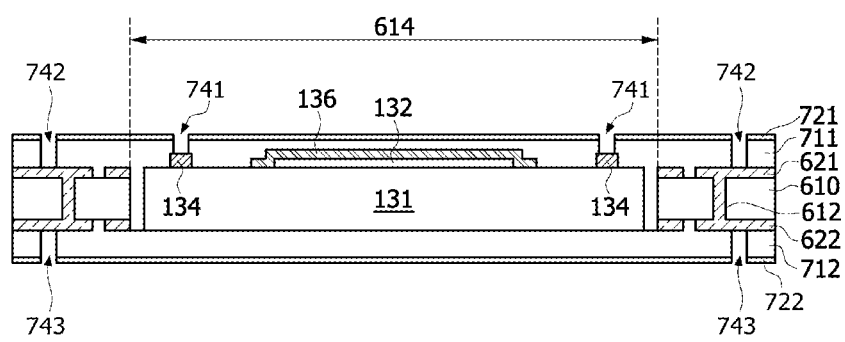

Referring to FIG. 34, the first seed layer 721 and the first insulation layer 711 may be patterned to form first upper via holes 741 exposing the connection members 134 and second upper via holes 742 exposing the first upper circuit patterns 621. In addition, the second seed layer 722 and the second insulation layer 712 may be patterned to form lower via holes 743 exposing the first lower circuit patterns 622. In some embodiments, the first upper via holes 741, the second upper via holes 742 and the lower via holes 743 may be formed using a laser drilling process.

Figure 35:
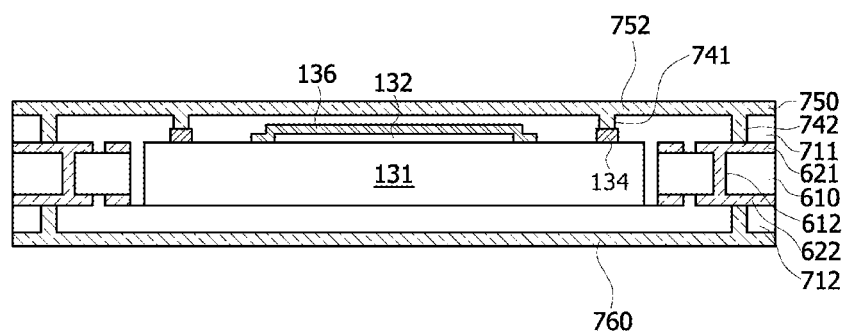

Referring to FIG. 35, a first metal layer 750 may be formed on the first insulation layer 711 and in the first and second upper via holes 741 and 742 using an electroplating process that employs the first seed layer (721 of FIG. 34) as a seed layer, and the second metal layer 760 may be formed on the second insulation layer 712 and in the lower via holes 743 using an electroplating process that employs the second seed layer (722 of FIG. 34) as a seed layer. In some embodiments, the first and second metal layers 750 and 760 may be simultaneously formed using a single electroplating process.

Figure 36:
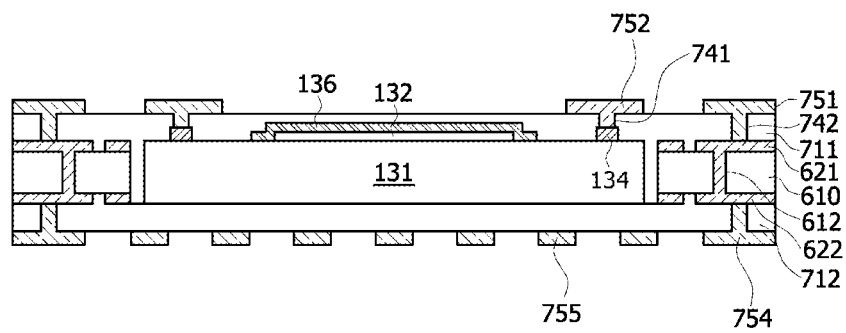

Referring to FIG. 36, the first metal layer (750 of FIG. 35) may be patterned to form second upper circuit patterns 751 and 752. The second upper circuit patterns 751 may be formed to be electrically connected to the first upper circuit patterns 621 through the second upper via holes 742. The second upper circuit patterns 752 may be formed to be electrically connected to the connection members 134 through the first upper via holes 741. The second metal layer (760 of FIG. 35) may be patterned to form second lower circuit patterns 754 and 755. The second lower circuit patterns 754 may be formed to be electrically connected to the first lower circuit patterns 622 through the lower via holes 743.

Figure 37:
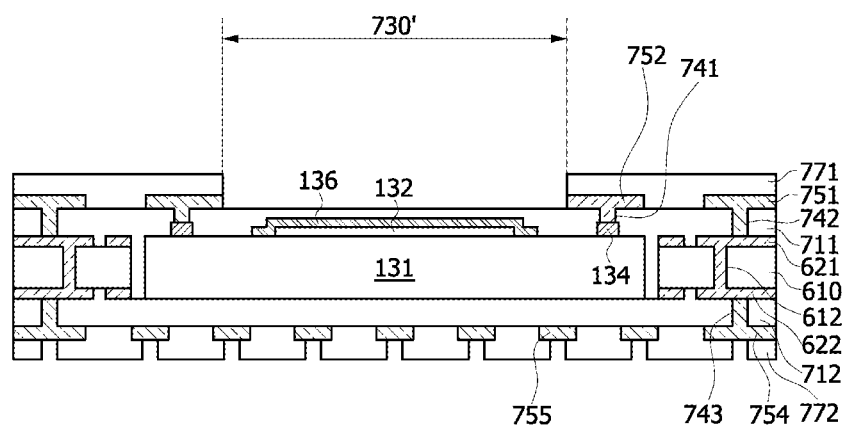

Referring to FIG. 37, a first solder resist layer 771 may be formed on the first insulation layer 711 to cover the second upper circuit patterns 751 and 752. The first solder resist layer 771 may be patterned to form a first preliminary opening 730' that exposes a portion of the first insulation layer 711 which is located over the metal mask 136. The first preliminary opening 730' may define a light receiving area including the light receiver 132. The first preliminary opening 730' may be formed to overlap with the metal mask 136. In some embodiments, the first preliminary opening 730' may be formed to have a planar area which is equal to or greater than a planar area of the metal mask 136. In addition, the second solder resist layer 772 may be formed on a bottom surface of the second insulation layer 712 to cover the second lower circuit patterns 754 and 755. The second solder resist layer 772 may be formed to have openings that expose the second lower circuit patterns 754 and 755.

Figure 38:
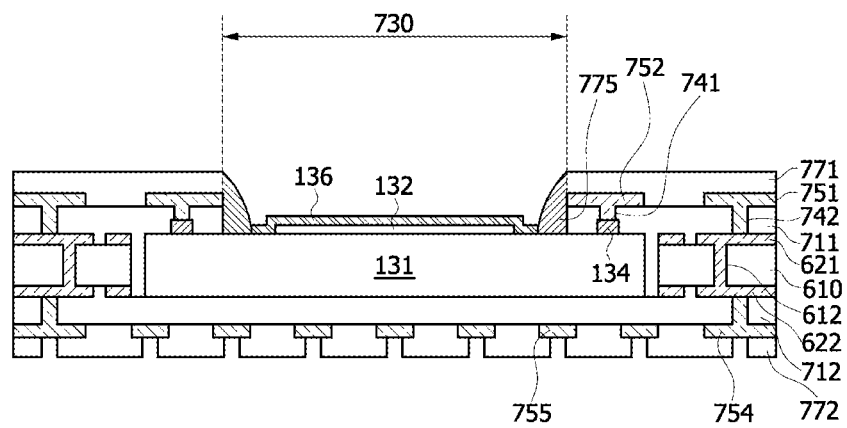

Referring to FIG. 38, the exposed portion of the first insulation layer 711 may be selectively etched using the first solder resist layer 771 as an etch mask to form a first opening 730 that exposes the metal mask 136. After the first opening 730 is formed, a protection layer 775 may be formed on inner sidewalls of the first insulation layer 711 exposed by the first opening 730. The protection layer 775 may be formed to extend onto inner sidewalls of the second upper circuit patterns 752 and the first insulation layer 711 exposed by the first opening 730. The protection layer 775 may be formed of an adhesive material or an underfill material. The protection layer 775 may be formed to cover all of the sidewalls of the first opening 730. As a result, all sidewalls of the light receiver 132 may be surrounded by the protection layer 775. Inner sidewalls of the protection layer 775 may define a second opening (732 of FIG. 39) which is narrower than the first opening 730. The metal mask 136 may still be exposed by the second opening 732.

Figure 39:
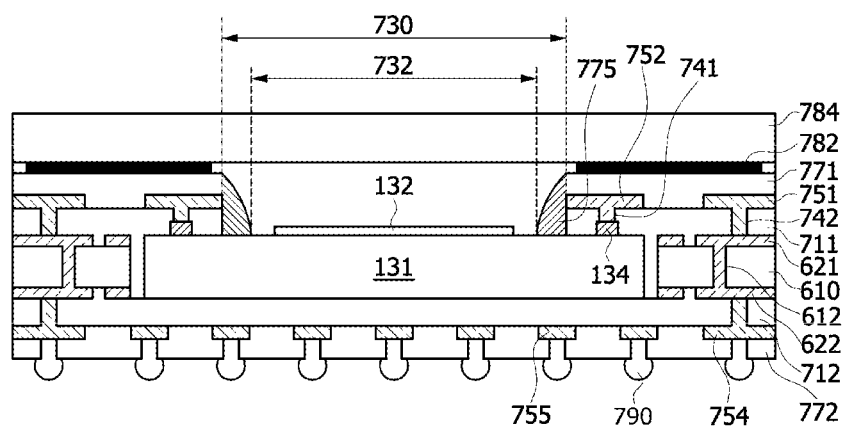

Referring to FIG. 39, after forming the protection layer 775, the metal mask (136 of FIG. 38) may be removed. While the metal mask (136 of FIG. 38) is removed, the second upper circuit patterns 751 and 752 may be covered with the first solder resist layer 771. Thus, the first solder resist layer 771 may prevent the second upper circuit patterns 751 and 752 from being etched or damaged while the metal mask (136 of FIG. 38) is removed. Meanwhile, the second lower circuit patterns 754 and 755 may be exposed by the openings of the second solder resist layer 772 while the metal mask (136 of FIG. 38) is removed. Accordingly, the second lower circuit patterns 754 and 755 may be formed of a metal material having a high etch selectivity with respect to the metal mask (136 of FIG. 38) to minimize damage to the second lower circuit patterns 754 and 755 while the metal mask (136 of FIG. 38) is removed.

After removal of the metal mask (136 of FIG. 38), the adhesive agent 782 may be supplied onto the first solder resist layer 771. A light transmission layer 784 may be attached to the first solder resist layer 771 using the adhesive agent 782. As a result, the second opening 732 may be covered with the light transmission layer 784. Subsequently, external connection terminals 790, for example, solder balls may be formed in respective openings of the second solder resist layer 772.

The embodiments have been disclosed above for illustrative purposes. Those skilled in the art will appreciate that various modifications, additions and substitutions are possible, without departing from the scope and spirit of the inventive concept as disclosed in the accompanying claims.

What is claimed is:

1. An embedded image sensor package comprising:
a core layer having a cavity therein;
an image sensor chip disposed in the cavity and having a top surface on which a light receiver and connection members are disposed;
a first insulation layer disposed on a top surface of the core layer and the top surface of the image sensor chip and having an opening that defines a light receiving area including the light receiver;
a protection layer disposed between the light receiver and the first insulation layer and surrounding the light receiver; and
a light transmission layer disposed over the light receiver,
wherein the protection layer is disposed along edges of the light receiving area and exposes the light receiver.

2. The embedded image sensor package of claim 1, further comprising:
a first upper circuit pattern disposed on the top surface of the core layer; and
a first lower circuit pattern disposed on a bottom surface of the core layer.

3. The embedded image sensor package of claim 2, wherein a bottom surface of the first lower circuit pattern is substantially coplanar with a bottom surface of the image sensor chip.

4. The embedded image sensor package of claim 2, wherein the first upper circuit pattern is electrically connected to the first lower circuit pattern via a through electrode that penetrates the core layer.

5. The embedded image sensor package of claim 2, further comprising second upper circuit patterns that are disposed on a top surface of the first insulation layer opposite to the core layer and are respectively connected to the connection members and the first upper circuit pattern.

6. The embedded image sensor package of claim 5, wherein the protection layer extends from the second upper circuit patterns connected to the connection members and covers entire surfaces of inner sidewalls of the first insulation layer exposed by the opening.

7. The embedded image sensor package of claim 6, wherein the protection layer and the second upper circuit patterns include the same material.

8. The embedded image sensor package of claim 6, further comprising a first solder resist layer that is disposed on the top surface of the first insulation layer and covers the second upper circuit patterns.

9. The embedded image sensor package of claim 8, wherein the first solder resist layer extends over entire surfaces of inner sidewalls of the protection layer.

10. The embedded image sensor package of claim 9, wherein the light transmission layer is attached to a top surface of the first solder resist layer using an adhesive layer.

11. The embedded image sensor package of claim 5, further comprising a first solder resist layer that is disposed on the top surface of the first insulation layer and covers the second upper circuit patterns.

12. The embedded image sensor package of claim 11, wherein the protection layer extends from the first solder resist layer and covers entire surfaces of inner sidewalls of the first insulation layer exposed by the opening.

13. The embedded image sensor package of claim 12, wherein the light transmission layer is attached to a top surface of the first solder resist layer using an adhesive layer.

14. The embedded image sensor package of claim 5, further comprising a first solder resist layer is disposed on the top surface of the first insulation layer and covers the second upper circuit patterns,
wherein the opening extends upwardly and penetrates the first solder resist layer.

15. The embedded image sensor package of claim 14, wherein the protection layer covers inner sidewalls of the first insulation layer, inner sidewalls of the second upper circuit patterns connected to the connection members, and inner sidewalls of the first solder resist layer which are exposed by the opening.

16. The embedded image sensor package of claim 15, wherein the protection layer includes an adhesive material or an underfill material.

17. The embedded image sensor package of claim 14, wherein the light transmission layer is attached to a top surface of the first solder resist layer using an adhesive layer.

18. The embedded image sensor package of claim 2, further comprising a second insulation layer disposed on the bottom surface of the core layer and covering the first lower circuit pattern and a bottom surface of the image sensor chip.

19. The embedded image sensor package of claim 18, further comprising a second lower circuit pattern disposed on a bottom surface of the second insulation layer opposite to the core layer,
wherein the second lower circuit pattern penetrates the second insulation layer to contact the first lower circuit pattern.

20. The embedded image sensor package of claim 19, further comprising a second solder resist layer that is disposed on a bottom surface of the second insulation layer and covers the second lower circuit pattern,
wherein the second solder resist layer has a through hole that exposes the second lower circuit pattern.

21. The embedded image sensor package of claim 18, wherein the first and second insulation layers include the same material.

22. The embedded image sensor package of claim 21, wherein each of the first and second insulation layers includes a polymer resin material that contains inorganic filler.

* * * * *